United States Patent
Yoo

(10) Patent No.: US 11,515,419 B2
(45) Date of Patent: Nov. 29, 2022

(54) FERROELECTRIC SEMICONDUCTOR DEVICE AND METHOD OF MANUFACTURING THE SAME

(71) Applicant: SK hynix Inc., Icheon-si (KR)

(72) Inventor: Hyangkeun Yoo, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 16/228,795

(22) Filed: Dec. 21, 2018

(65) Prior Publication Data

US 2019/0348539 A1 Nov. 14, 2019

(30) Foreign Application Priority Data

May 10, 2018 (KR) .................... 10-2018-0053957

(51) Int. Cl.
| | |
|---|---|
| *H01L 29/78* | (2006.01) |
| *H01L 29/51* | (2006.01) |
| *H01L 29/66* | (2006.01) |
| *H01L 29/08* | (2006.01) |
| *H01L 27/11585* | (2017.01) |

(52) U.S. Cl.
CPC .... *H01L 29/78391* (2014.09); *H01L 29/0847* (2013.01); *H01L 29/516* (2013.01); *H01L 29/6684* (2013.01); *H01L 27/11585* (2013.01)

(58) Field of Classification Search
None
See application file for complete search history.

(56) References Cited

U.S. PATENT DOCUMENTS

| | | | |
|---|---|---|---|
| 9,722,093 B1 * | 8/2017 | Xing | H01L 29/4908 |
| 2001/0042888 A1 * | 11/2001 | Willer | H01L 29/78391 |
| | | | 257/295 |
| 2004/0057274 A1 * | 3/2004 | Dimmler | G11C 11/22 |
| | | | 257/E29.272 |
| 2009/0127603 A1 * | 5/2009 | Yamakawa | H01L 27/11502 |
| | | | 257/E27.113 |
| 2014/0070290 A1 | 3/2014 | Inumiya et al. | |
| 2014/0138753 A1 * | 5/2014 | Ramaswamy | H01L 29/6684 |
| | | | 257/295 |
| 2016/0118404 A1 | 4/2016 | Peng | |
| 2017/0005261 A1 * | 1/2017 | Fujii | H01L 45/1253 |
| 2017/0117295 A1 | 4/2017 | Karda et al. | |
| 2019/0019875 A1 * | 1/2019 | Tsai | H01L 29/4966 |
| 2019/0058049 A1 * | 2/2019 | Then | H01L 29/2003 |

(Continued)

FOREIGN PATENT DOCUMENTS

| | | | | |
|---|---|---|---|---|
| KR | 10-2015-0082629 A | | 7/2015 | |
| WO | WO-2017171851 A1 * | 10/2017 | ....... H01L 29/78391 |

OTHER PUBLICATIONS

The Office Action from KIPO for the corresponding KR application No. 10-2018-0053956, dated Jul. 17, 2022.

*Primary Examiner* — Nishath Yasmeen

(57) ABSTRACT

A ferroelectric semiconductor device of the present disclosure includes a substrate having a channel structure, a trench pattern having a bottom surface and a sidewall surface in the channel structure, a dielectric layer disposed on the bottom surface and the sidewall surface of the trench pattern, and a gate electrode layer disposed on the dielectric layer. The dielectric layer includes a ferroelectric layer pattern and a non-ferroelectric layer pattern that are disposed along the sidewall surface of the trench pattern.

10 Claims, 38 Drawing Sheets

(56) References Cited

U.S. PATENT DOCUMENTS

2019/0096767 A1\* 3/2019 Yeh ........................ H01L 21/324
2019/0296122 A1\* 9/2019 Ino ......................... H01L 29/513
2020/0282484 A1\* 9/2020 Heo ................... H01L 29/78391

\* cited by examiner

FERROELECTRIC SEMICONDUCTOR DEVICE AND METHOD OF MANUFACTURING THE SAME

CROSS-REFERENCE TO RELATED APPLICATION

The present application claims priority under 35 U.S.C. 119(a) to Korean Patent Application No. 10-2018-0053957, filed on May 10, 2018, which is herein incorporated by reference in its entirety.

BACKGROUND

1. Technical Field

Various embodiments of the present disclosure generally relate to a semiconductor device, and more particularly, relate to a ferroelectric semiconductor device and a method of manufacturing the same.

2. Related Art

Generally, a ferroelectric material refers to a material having spontaneous electrical polarization in a state in which no external electric field is applied. In addition, the ferroelectric material can exhibit a polarization hysteresis behavior when an external electric field is applied. At this time, the applied electric field can be controlled so that the ferroelectric material has any one of two stable remanent polarization states on the polarization hysteresis curve. Such characteristic can be utilized to store logic information of "0" or "1" in a nonvolatile manner.

Recently, a field effect transistor-type ferroelectric memory device in which the ferroelectric material is used in a gate dielectric layer has been studied. A write operation of the ferroelectric memory device may be performed by applying a predetermined write voltage to a gate electrode layer and storing different remanent polarization states in the gate dielectric layer as logic information. A read operation of the ferroelectric memory device may be formed by reading an operation current passing through a channel layer of the field effect transistor, in which a channel resistance of the field effect transistor changes depending on different possible remanent polarization states written in the gate dielectric layer.

SUMMARY

There is disclosed a ferroelectric semiconductor device according to an aspect of the present disclosure. A ferroelectric semiconductor device according to an embodiment of the present disclosure includes a substrate having a channel structure, a trench pattern having a bottom surface and a sidewall surface in the channel structure, a dielectric layer disposed on the bottom surface and the sidewall surface of the trench pattern, and a gate electrode layer disposed on the dielectric layer. The dielectric layer includes a ferroelectric layer pattern and a non-ferroelectric layer pattern that are disposed along the sidewall surface of the trench pattern.

There is disclosed a method of manufacturing a ferroelectric semiconductor device according to another aspect of the present disclosure. In the method, a substrate having a channel structure is provided. The channel structure includes a trench pattern having a bottom surface and a sidewall surface. An amorphous ferroelectric material layer is formed on the bottom surface and the sidewall surface of the trench pattern. Insulation layers and ferroelectric crystallization inducing layers are alternately stacked on the ferroelectric material layer from the bottom surface in a direction perpendicular to the bottom surface. Portions of the ferroelectric material layer that contact the ferroelectric crystallization inducing layers, are crystallized to form a ferroelectric layer pattern, and portions of the ferroelectric material layer that contact the insulating layer, are crystallized to form a non-ferroelectric layer pattern.

DETAILED DESCRIPTION

Figure 1A:
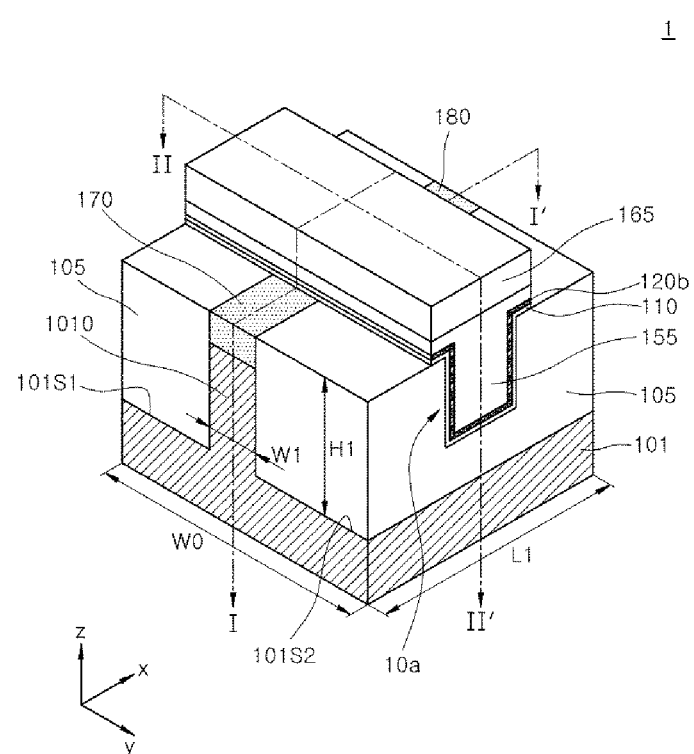
FIGS. 1A to 1C are views schematically illustrating a ferroelectric semiconductor device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise", "include" or "have"

are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

In this specification, the orientation of a structure is described using an orthogonal coordinate system having the x-axis, y-axis and z-axis. Here, the x-direction may mean a direction parallel to the x-axis. Likewise, the y-direction may mean a direction parallel to the y-axis, and the z-direction may mean a direction parallel to the z-axis.

Figure 1B:
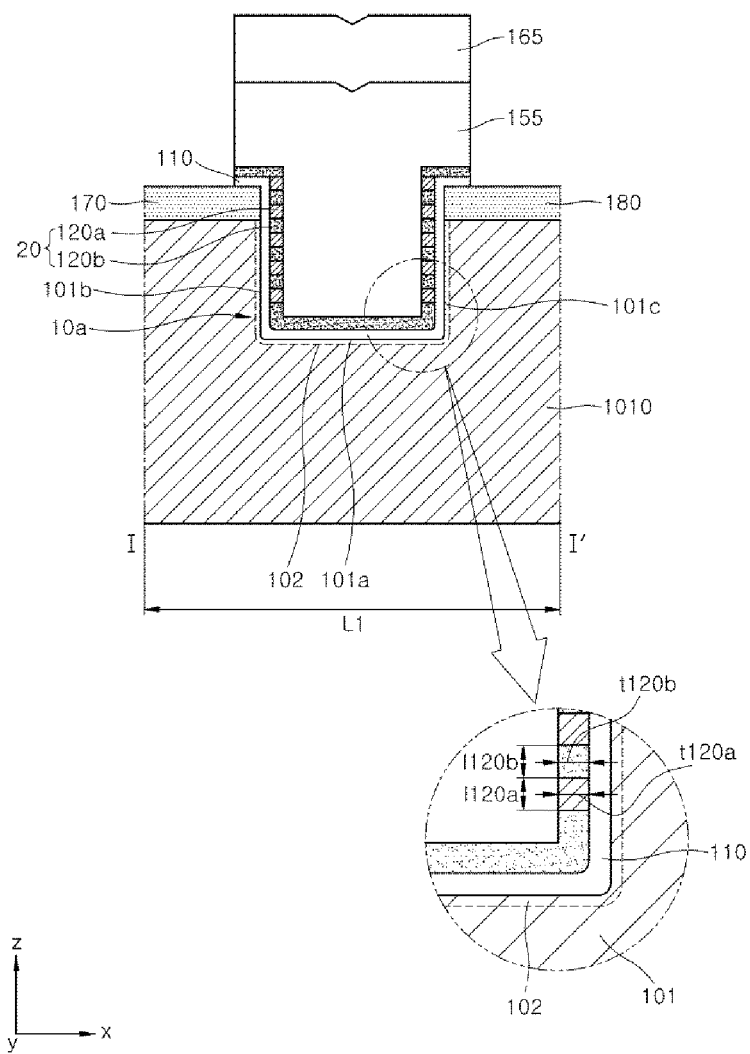
Figure 1C:
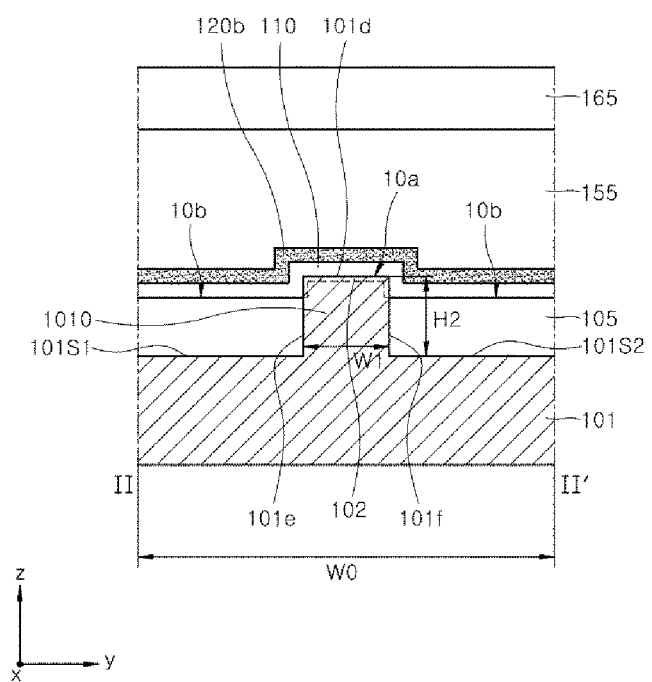

FIGS. 1A to 1C are views schematically illustrating a ferroelectric semiconductor device 1 according to an embodiment of the present disclosure. Specifically, FIG. 1A is a perspective view of the ferroelectric semiconductor device 1, FIG. 1B is a cross-sectional view taken along the line I-I' of the ferroelectric semiconductor device 1 of FIG. 1A, and FIG. 1C is a cross-sectional view taken along the line II-II' of the ferroelectric semiconductor device 1 of FIG. 1A. The ferroelectric semiconductor device 1 may be a transistor device that has a Saddle type channel structure such as that illustrated by channel structure 1010. The ferroelectric semiconductor device 1 can function as a nonvolatile memory device storing remanent polarization of a ferroelectric material layer as signal information.

Referring to FIGS. 1A to 1C, the ferroelectric semiconductor device 1 may include a substrate 101 having a channel structure 1010, a dielectric layer 20 disposed on at least a portion of the channel structure 1010, and a gate electrode layer 155. The dielectric layer 20 may include a ferroelectric layer pattern 120a and a non-ferroelectric layer pattern 120b. The ferroelectric semiconductor device 1 may include a source region 170 and a drain region 180 formed in the channel structure 1010 located at the opposite ends or sides of the gate electrode layer 155.

The substrate 101 may, for example, include a semiconductor material. The substrate 101 may, for example, be a silicon (Si) substrate, a gallium arsenide (GaAs) substrate, an indium phosphide (InP) substrate, a germanium (Ge) substrate, or a silicon germanium (SiGe) substrate. In an embodiment, the substrate 101 may be doped to have conductivity. As an example, the substrate 101 may be doped with a p-type dopant or an n-type dopant.

The channel structure 1010 may be arranged to protrude from a first surface 101S1 and a second surface 101S2 of the substrate 101 in the z-direction. The first and second surfaces 101S1 and 101S2 may be substantially on the same plane. The channel structure 1010 may be formed of the same material as that used in substrate 101. That is, the channel structure 1010 may be formed by patterning or etching the substrate 101 and may form a portion of the substrate 101. The channel structure 1010 may have predetermined length L1, width W1 and height H1 along the x-direction, y-direction and z-direction, respectively. Here, the length L1 may mean the greatest distance between the ends of source region 170 and the drain region 180, as measured along the x-direction, and the height H1 may mean a distance from the first or second surfaces 101S1 and 101S2 to an upper surface of the source region 170 and the drain region 180.

Referring to FIGS. 1A and 1C, an interlayer insulation layer 105 may be disposed on at least a portion of the substrate 101. The interlayer insulation layer 105 may be disposed on the substrate 101 adjacent to the channel structure 1010. The interlayer insulation layer 105 may, for example, include silicon oxide, silicon nitride, silicon oxynitride, aluminum nitride, aluminum oxide, or a combination of two or more thereof.

Meanwhile, referring to FIGS. 1A and 1B, the channel structure 1010 may have a first trench pattern 10a. The first trench pattern 10a may have a bottom surface 101a substantially parallel to a plane formed by the x-direction and y-direction and sidewall surfaces 101b and 101c substantially parallel to a plane formed by the y-direction and z-direction. An interfacial insulation layer 110 may be disposed on the bottom surface 101a and the sidewall surfaces 101b and 101c of the first trench pattern 10a. The dielectric layer 20 may be disposed on the interfacial insulation layer 110. As illustrated in FIGS. 1A and 1C, the channel structure 1010 may have a second height H2 that is less than the first height H1 due to the formation of the first trench pattern 10a.

Meanwhile, a second trench pattern 10b may be positioned adjacent to the channel structure 1010 having the first trench pattern 10a. The second trench pattern 10b may be formed by selectively etching the interlayer insulation layer 105 and may expose some portions of the side surfaces 101e and 101f of the channel structure 1010. Consequently, as illustrated in FIG. 1C, the channel structure 1010 adjacent to the second trench pattern 10b may have an upper surface 101d and side surfaces 101e and 101f. The upper surface 101d may be substantially the same as the bottom surface 101a of the first trench pattern 10a of FIG. 1B. In addition, as illustrated in FIG. 1C, the interfacial insulation layer 110 may be disposed on the interlayer insulation layer 105, the entire upper surface 101d of the channel structure 1010, and parts of the side surfaces 101e and 101f.

The interfacial insulation layer 110 may be interposed between the substrate 101 and the dielectric layer 20 to suppress or limit the diffusion of materials between the substrate 101 and the dielectric layer 20 during the manufacturing process. In addition, the interfacial insulation layer 110 can prevent direct contact between the substrate 101 and the dielectric layer 20. The interfacial insulation layer 110 may prevent or reduce crystal defects generated at an interface between the substrate 101 and the dielectric layer 20 due to strain resulting from lattice constants of different sizes.

In an embodiment, the interfacial insulation layer 110 may have an amorphous structure. The interfacial insulation layer 110 may, for example, include silicon oxide, silicon nitride, silicon oxynitride, or aluminum oxide. As an example, when the substrate 101 is a silicon (Si) substrate, the interfacial insulation layer 110 may be a silicon oxide layer, a silicon nitride layer, or a silicon oxynitride layer. The interfacial insulation layer 110 may have a thickness of more than zero (0) to five nanometers (5 nm), for example.

The dielectric layer 20 may be disposed on the interfacial insulation layer 110. The dielectric layer 20 may include a ferroelectric layer pattern 120a and a non-ferroelectric layer pattern 120b. The ferroelectric layer pattern 120a and the non-ferroelectric layer pattern 120b may each have a crystalline structure. The ferroelectric layer pattern 120a may have predetermined remanent polarization in a state where no external voltage or external current is supplied. On the other hand, the non-ferroelectric layer pattern 120b may lack remanent polarization when no external voltage or external current is supplied. As examples, the non-ferroelectric layer pattern 120b may have a paraelectric property or an anti-ferroelectric property.

The ferroelectric layer pattern 120a may be disposed on the sidewall surfaces 101b and 101c of the first trench pattern 10a. In FIG. 1B, the interfacial insulation layer 110 is interposed between dielectric layer 20 and the sidewall surfaces of trench pattern 10a. The ferroelectric layer pattern 120a and the non-ferroelectric layer pattern 120b may be alternately disposed or interleaved along the sidewall surfaces 101b and 101c of the first trench pattern 10a, resulting in a dielectric layer 20 with alternating ferroelectric and non-ferroelectric portions stacked in the thickness of z-direction. In an embodiment, as illustrated in FIG. 1B, only the non-ferroelectric layer pattern 120b is disposed on the bottom surface 101a of the first trench pattern 10a. In addition, as illustrated in FIG. 1C, in a region of the channel structure 1010, in which the first and second trench patterns 10a and 10b are formed, only the non-ferroelectric layer pattern 120b is disposed on the interfacial insulation layer 110.

In an embodiment, the ferroelectric layer pattern 120a and the non-ferroelectric layer pattern 120b may each be a portion of the dielectric layer 20. The ferroelectric layer pattern 120a may be a portion of dielectric layer 20 having a ferroelectric property. The non-ferroelectric layer pattern 120b may be a portion of dielectric layer 20 that does not have a ferroelectric property. That is, the ferroelectric layer pattern 120a and the non-ferroelectric layer pattern 120b may have substantially the same chemical composition, but may have different crystal lattice structures.

In examples, the dielectric layer 20 may include hafnium oxide, zirconium oxide, hafnium zirconium oxide, or a combination of two or more thereof. The ferroelectric layer pattern 120a may be a portion of dielectric layer 20 having a crystal lattice structure of an orthorhombic crystal system. The non-ferroelectric layer pattern 120b may be a portion of dielectric layer 20 having a crystal lattice structure of a tetragonal crystal system, a cubic crystal system, or a monoclinic crystal system.

In an embodiment, the ferroelectric layer pattern 120a may include a dopant. As an example, when the ferroelectric layer pattern 120a includes hafnium oxide, zirconium oxide, hafnium zirconium oxide, or a combination of two or more thereof, the dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Ga), lanthanum (La), or a combination of two or more thereof. The dopant can increase the magnitude of the ferroelectric polarization of the ferroelectric layer pattern 120a, or improve the retention of remanent polarization in the ferroelectric layer pattern 120a. The non-ferroelectric layer pattern 120b may include the same dopant as the ferroelectric layer pattern 120a.

Referring to FIG. 1B, the ferroelectric layer pattern 120a may have predetermined thickness t120a and length l120a. In addition, referring to FIG. 1A, the ferroelectric layer pattern 120a may extend along the y-direction and span a predetermined width W0. In an embodiment, the thickness t120a and length l120a may be the thickness and length of the ferroelectric layer pattern 120a when the ferroelectric layer pattern 120a has a single grain structure. Meanwhile, the width W0 may depend on the size of the ferroelectric semiconductor device 1, and may be greater than the thickness t120a and the length l120a. The width W0 may be equal to or greater than the thickness t120a and the length l120a of the ferroelectric layer pattern 120a when the ferroelectric layer pattern 120a has a single grain structure.

As an example, the thickness t120a may be about five nanometers (5 nm) to fifteen nanometers (15 nm), and the length l120a may be about five nanometers (5 nm) to thirty nanometers (30 nm). Meanwhile, the non-ferroelectric layer pattern 120b may have predetermined thickness t120b and length l120b. In addition, the non-ferroelectric layer pattern 120b may span a predetermined width W0. The thickness of the non-ferroelectric layer pattern 120b may be substantially the same as the thickness of the ferroelectric layer pattern 120a. The length l120b of the non-ferroelectric layer pattern 120b may be predetermined or may correspond to an interval between portions of the ferroelectric layer pattern 120a. The length l120b of the non-ferroelectric layer pattern 120b may, for example, be one nanometer (1 nm) to thirty nanometers (30 nm). The length l120b of the non-ferroelectric layer pattern 120b may be determined in consideration of the density of the portions of ferroelectric layer pattern 120a disposed along the sidewall surfaces 101b and 101c. That is, as the length l120b of the non-ferroelectric layer pattern 120b decreases, the density or total area of the ferroelectric layer pattern 120a disposed along the sidewall surfaces 101b and 101c may increase.

According to an embodiment of the present disclosure, it is possible to realize a cross-sectional structure of a single crystal grain along the thickness direction and longitudinal or lengthwise direction by controlling the thickness t120a and length l120a of the ferroelectric layer pattern 120a to a thickness and a length within the dimensional range of a single crystal grain. Since the axes of ferroelectric polarization can be arranged uniformly a layer of single crystal grains, the uniformity of orientation of the ferroelectric polarization aligned along the axis of the polarization in the ferroelectric layer pattern 120a can be improved in such layers. Since the uniformity of orientation of the polarization is improved, the magnitude of the ferroelectric polarization can be increased or improved. As a result, in an embodiment, the alignment degree of the polarization orientations along the thickness direction and longitudinal direction is improved in the ferroelectric layer pattern 120a so that the magnitude of the remanent polarization per unit area in the ferroelectric layer pattern 120a can be increased.

Referring to FIG. 1B, the gate electrode layer 155 may be disposed to fill the first trench pattern 10a of the channel structure 1010. The gate electrode layer 155 may be disposed to protrude above the channel structure 1010. The gate electrode layer 155 may be disposed to cover the ferroelectric layer pattern 120a and the non-ferroelectric layer pattern 120b. Referring to FIG. 1C, in a region of the channel structure 1010 in which the first and second trench patterns 10a and 10b are formed, the gate electrode layer 155 may be disposed on or arranged to cover the non-ferroelectric layer pattern 120b. An upper electrode layer 165 may be disposed on the gate electrode layer 155.

The gate electrode layer 155 and the upper electrode layer 165 may each include a conductive material. The conductive material may, for example, include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or combinations of two or more thereof. In an embodiment, the upper electrode layer 165 may include a material having lower resistivity than the gate electrode layer 155. In some embodiments, the upper electrode layer 165 may be omitted.

The source region 170 and the drain region 180 may be disposed in regions of the channel structure 1010, which are located at opposite ends or sides of the gate electrode layer 155 or the first trench pattern 10a. The source region 170 and the drain region 180 may be regions doped with dopants of a different type than that of dopants used in the channel structure 1010. As an example, when the channel structure 1010 is doped into p-type, the source region 170 and the drain region 180 may be doped into n-type. As another example, when the channel structure 1010 is doped into n-type, the source region 170 and the drain region 180 may be doped into p-type.

In some embodiments, when the diffusion of materials between the substrate 101 and the dielectric layer 20 is sufficiently suppressed through control of manufacturing processes, the interfacial insulation layer 110 can be omitted. In addition, when the amount of deformation or defects at the interface between the substrate 101 and the dielectric layer 20 is reduced by using materials having smaller differences in lattice constant between the substrate 101 and the dielectric layer 20, the interfacial insulation layer 110 may be omitted. When the interfacial insulation layer 110 is omitted, the ferroelectric layer pattern 120a and the non-ferroelectric layer pattern 120b may be directly disposed in the first trench pattern 10a in the channel structure 1010.

A method of operating a ferroelectric semiconductor device according to an embodiment of the present disclosure can be described as follows with reference to FIGS. 1A to 1C. First, a write operation will be described.

A write voltage may be applied between a gate electrode layer 155 and a substrate 101, while a source region 170 and a drain region 180 are grounded, so that remanent polarization may be written in a ferroelectric layer pattern 120a in a nonvolatile manner. As an example, after a bias having a positive polarity is applied to the gate electrode layer 155 while the substrate 101 is grounded, the bias is removed. As a result, in the ferroelectric layer pattern 120a, first remanent polarization aligned in a direction perpendicular to the sidewall surfaces 101b and 101c of a first trench pattern 10a and in a direction parallel to the bottom surface 101a. That is, the first remanent polarization may be laterally aligned in a direction of the channel structure 1010 from the gate electrode layer 155 and can be maintained after the bias is removed. As another example, after a bias having a negative polarity is applied to the gate electrode layer 155, while the substrate 101 is grounded, the bias is removed. As a result, in the ferroelectric layer pattern 120a, a second remanent polarization aligned in a direction perpendicular to the sidewall surfaces 101b and 101c of the first trench pattern 10a and in a direction parallel to the bottom surface 101a. That is, the second remanent polarization may be laterally aligned in a direction of the gate electrode layer 155 from the channel structure 1010 and can be maintained after the bias is removed. The non-ferroelectric layer 120b does not have remanent polarization.

Next, a read operation will be described. A read voltage may be applied between the gate electrode layer 155 and the substrate 101 while a predetermined source-drain voltage is applied between the source region 170 and the drain region 180 to form a channel layer 102 in a channel structure 1010. Accordingly, conductive carriers such as electrons or holes may flow along the channel layer 102 between the source region 170 and the drain region 180 consistent with the applied source-drain voltage. The first or second remanent polarization in the ferroelectric layer pattern 120a can increase or decrease the density of the flowing conductive carriers. As an example, when the first remanent polarization is stored in the ferroelectric layer pattern 120a, electrons can be induced into the channel layer 102 from the channel structure 1010, or holes in the channel layer 102 can be ejected from the channel layer 102. Accordingly, the density of electrons can be increased, or the density of holes can be reduced, in the channel layer 102 at or near the dielectric layer 20. As another example, when the second remanent polarization is stored in the ferroelectric layer pattern 120a, holes can be induced in the channel layer 102 from the channel structure 1010, or electrons ejected from the channel layer 102. Accordingly, the density of electrons can be decreased, or the density of holes can be increased in the channel layer 102 at or near the dielectric layer 20. That is, depending on the orientation of the remanent polarization stored in the ferroelectric layer pattern 120a, the density of the conductive carriers flowing along the channel layer 102 may be varied in a read operation. As a result, the read operation may include reading the magnitude of the current flowing along the channel layer 102 and determining signal information, which corresponds to the remanent polarization stored in the ferroelectric layer pattern 120a.

As described above, in an embodiment, the degree of alignment of the polarization orientation along the thickness direction and longitudinal direction is improved in the ferroelectric layer pattern 120a so that the magnitude of the remanent polarization of the ferroelectric layer pattern 120a can be increased. As a result, the difference in polarization value between the first remanent polarization and the second remanent polarization can be increased, thereby improving the ability to store and read different signal information.

Figure 2A:
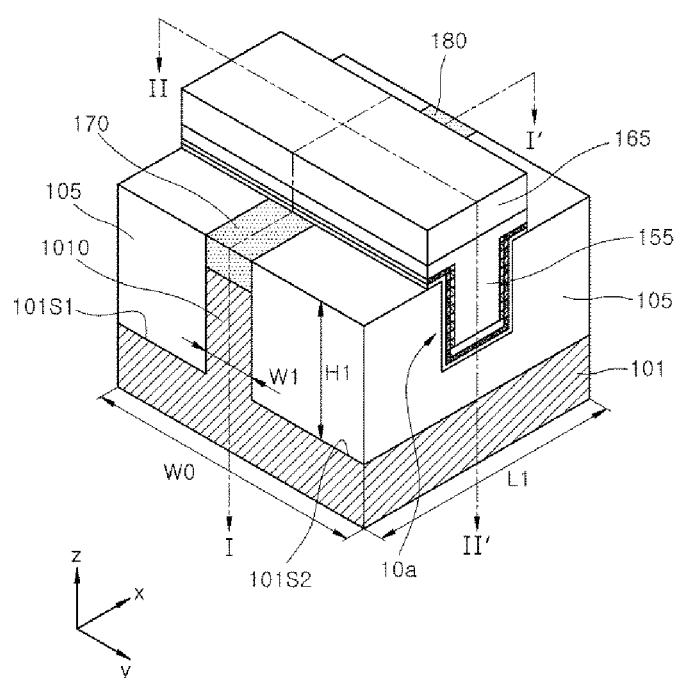
FIGS. 2A to 2C are views schematically illustrating a ferroelectric semiconductor device according to another embodiment of the present disclosure.
Figure 2B:
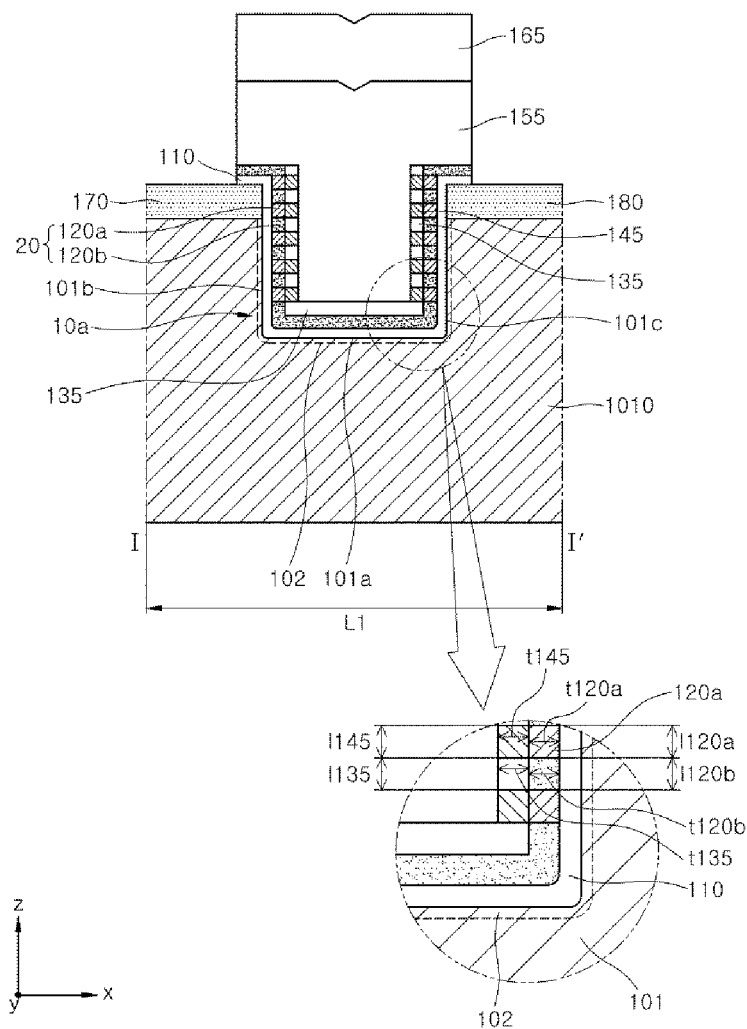
Figure 2C:
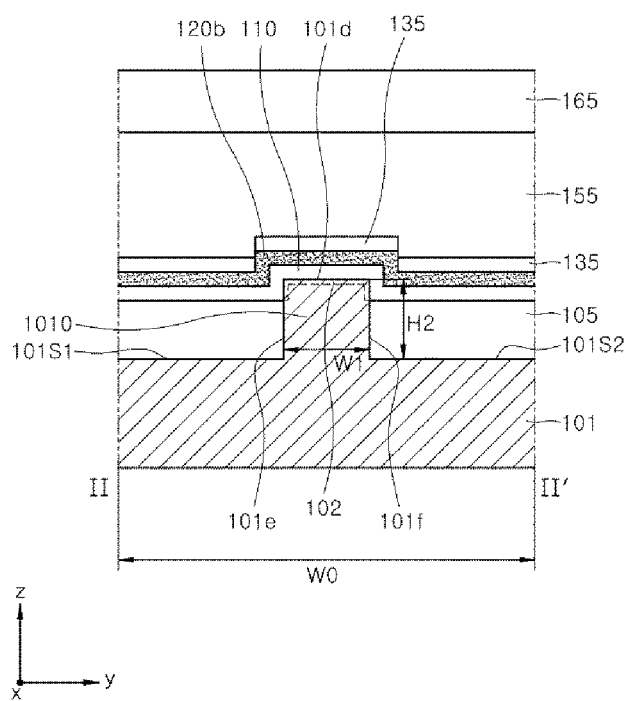

FIGS. 2A to 2C are views schematically illustrating a ferroelectric semiconductor device 2 according to another embodiment of the present disclosure. Specifically, FIG. 2A is a perspective view of the ferroelectric semiconductor device 2, FIG. 2B is a cross-sectional view taken along the line I-I' of the ferroelectric semiconductor device 2 of FIG. 2A, and FIG. 2C is a cross-sectional view taken along the line II-II' of the ferroelectric semiconductor device 2 of FIG. 2A. The ferroelectric semiconductor device 2 illustrated in FIGS. 2A to 2C further has an insulation pattern 135 and a diffusion barrier layer pattern 145 as compared with the ferroelectric semiconductor device 1 illustrated in FIGS. 1A to 1C.

Referring to FIGS. 2B and 2C, the insulation pattern 135 may be disposed between a non-ferroelectric layer pattern 120b, disposed on a bottom surface 101a of a first trench pattern 10a, and a gate electrode layer 155. In addition, the insulation pattern 135 may be disposed between the non-ferroelectric layer pattern 120b, disposed on sidewall surfaces 101b and 101c of a first trench pattern 10a, and the gate electrode layer 155. Meanwhile, the diffusion barrier layer pattern 145 may be disposed between the non-ferroelectric layer pattern 120b, disposed on sidewall surfaces 101b and 101c of first trench pattern 10a, and the gate electrode layer 155. The diffusion barrier layer pattern 145 may act to suppress material migration due to diffusion between the ferroelectric layer pattern 120a and the gate electrode layer 155. As an example, when the ferroelectric layer pattern 120a includes an oxide and the gate electrode layer 155 includes metal that reacts with oxygen, an undesirable reaction can take place during the manufacturing of the ferroelectric semiconductor device 2. Therefore, the oxidation of the oxygen in the ferroelectric layer pattern 120a and the metal in the gate electrode layer 155 resulting in diffusion can be suppressed by the diffusion barrier layer pattern 145. As a result, it is possible to prevent or reduce the gate electrode layer 155 from being deteriorated by the diffusion and the oxidation.

In an embodiment, the diffusion barrier layer pattern 145 may have predetermined length l145 and thickness t145. The length l145 of the diffusion barrier layer pattern 145 may be substantially the same as the length l120a of the ferroelectric layer pattern 120a. The thickness t145 of the diffusion barrier layer pattern 145 may be controlled to a size sufficient to suppress the oxidation reaction due to the above-described material diffusion. As an example, the thickness t145 of the diffusion barrier layer pattern 145 may be about five nanometers (5 nm) to thirty nanometers (30 nm). Also, referring to FIG. 2A, the diffusion barrier layer pattern 145 may have a width corresponding to a predetermined width W0.

Meanwhile, the insulation pattern 135 may have predetermined length l135 and thickness t135. The length l135 of the insulation pattern 135 may be substantially the same as the length l120b of the non-ferroelectric layer pattern 120b. The thickness t135 of the insulation pattern 135 may be substantially the same as the thickness t145 of the diffusion barrier layer pattern 145. Also, referring to FIG. 2A, the insulation pattern 135 may have a width corresponding to a predetermined width W0.

The insulation pattern 135 may have an amorphous structure. The insulation pattern 135 may, for example, include oxide, nitride, oxynitride and the like. The insulation pattern 135 may, for example, include silicon oxide, silicon nitride, silicon oxynitride and the like. The diffusion barrier layer pattern 145 may have a crystalline structure. The diffusion barrier layer pattern 145 may, for example, include titanium nitride, tantalum nitride and the like. The diffusion barrier layer pattern 145 may have a different lattice constant from that of the ferroelectric layer pattern 120a. As will be described later, the diffusion barrier layer pattern 145 results from crystallization heat treatment of a ferroelectric crystallization inducing layer. Specifically, the ferroelectric crystallization inducing layer may serve to induce the ferroelectric layer pattern 120a to have a ferroelectric crystal structure at the time of the crystallization heat treatment. The diffusion barrier layer pattern 145 may have a different lattice constant from that of the ferroelectric layer pattern 120a so that a strain can be formed inside the ferroelectric layer pattern 120a, resulting in an electric field due to a flexoelectric effect inside the ferroelectric layer pattern 120a. The electric field can contribute to stable maintenance of ferroelectric properties or predetermined remanent polarization of the ferroelectric layer pattern 120a during the crystallization process. The ferroelectric crystallization inducing layer may be patterned after the crystallization heat treatment process, and become diffusion barrier layer pattern 145 between the ferroelectric layer pattern 120a and the gate electrode layer 155.

Figure 3:
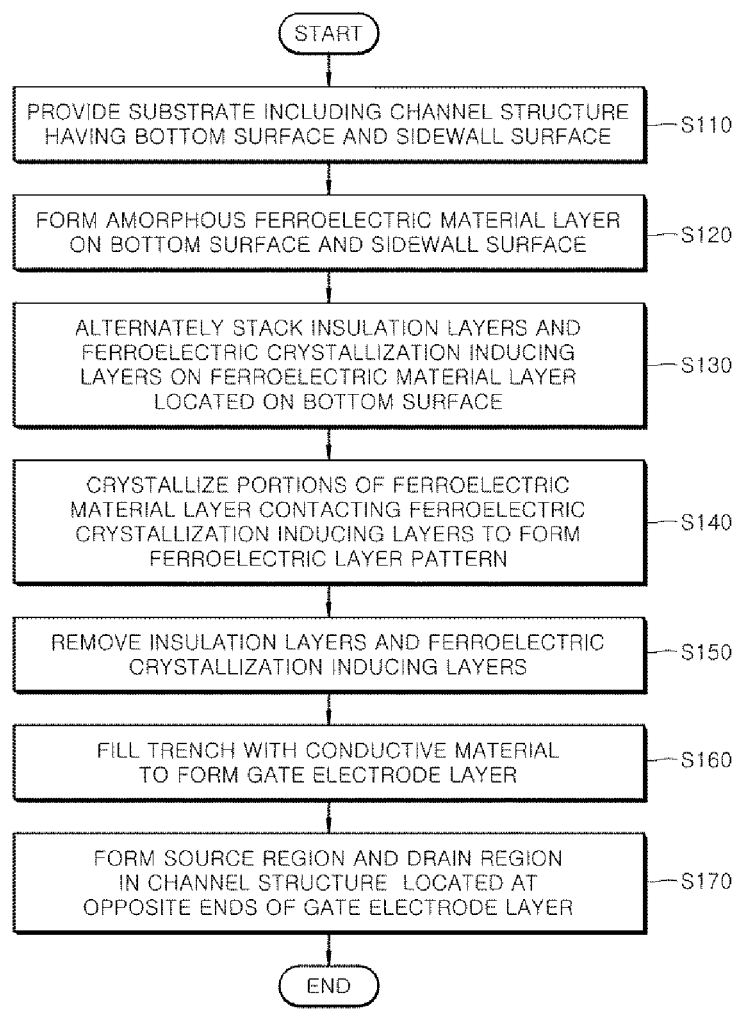
FIG. 3 is a flow chart schematically illustrating a method of manufacturing a ferroelectric semiconductor device according to an embodiment of the present disclosure.

FIG. 3 is a flow chart schematically illustrating a method of manufacturing a ferroelectric semiconductor device according to an embodiment of the present disclosure. FIGS. 4 to 6, 7A, 8A, 9A, 10A, 11A and 12A are perspective views schematically illustrating a method of manufacturing a ferroelectric semiconductor device according to embodiments of the present disclosure. FIGS. 7B, 8B, 9B, 10B, 11B and 12B are cross-sectional views taken along the line A-A' of a structure in FIGS. 7A, 8A, 9A, 10A, 11A and 12A, respectively to illustrate methods of manufacturing a ferroelectric semiconductor device. FIGS. 7C, 8C, 9C, 10C, 11C and 12C are cross-sectional views taken along the line B-B' of the structure in FIGS. 7A, 8A, 9A, 10A, 11A and 12A, respectively to illustrate methods of manufacturing a ferroelectric semiconductor device.

Figure 4:
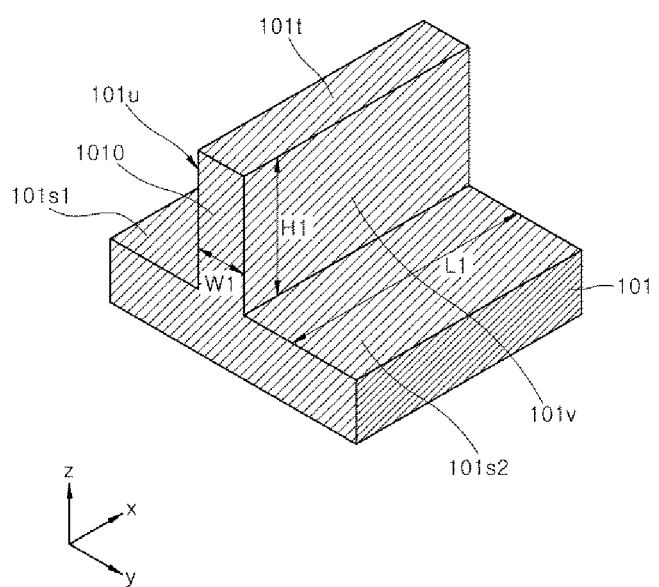
FIGS. 4 to 6, 7A, 8A, 9A, 10A, 11A and 12A are perspective views schematically illustrating a method of manufacturing a ferroelectric semiconductor device according to an embodiment of the present disclosure.
Figure 5:
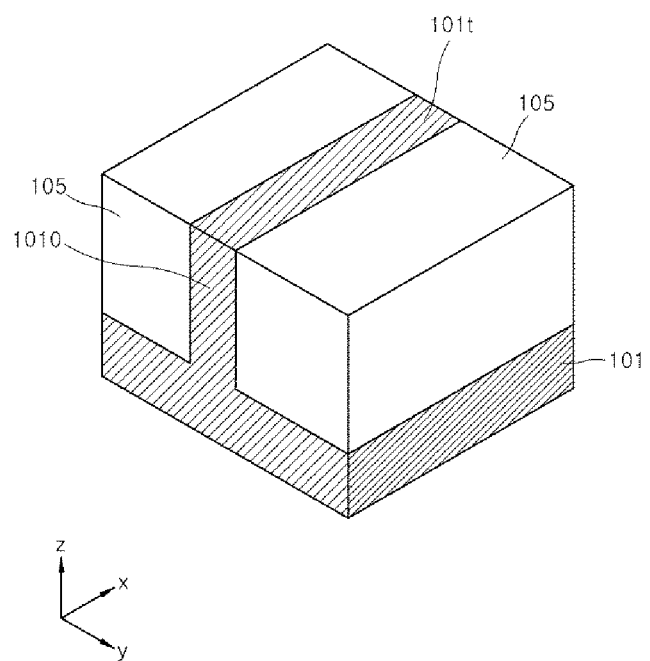
Figure 6:
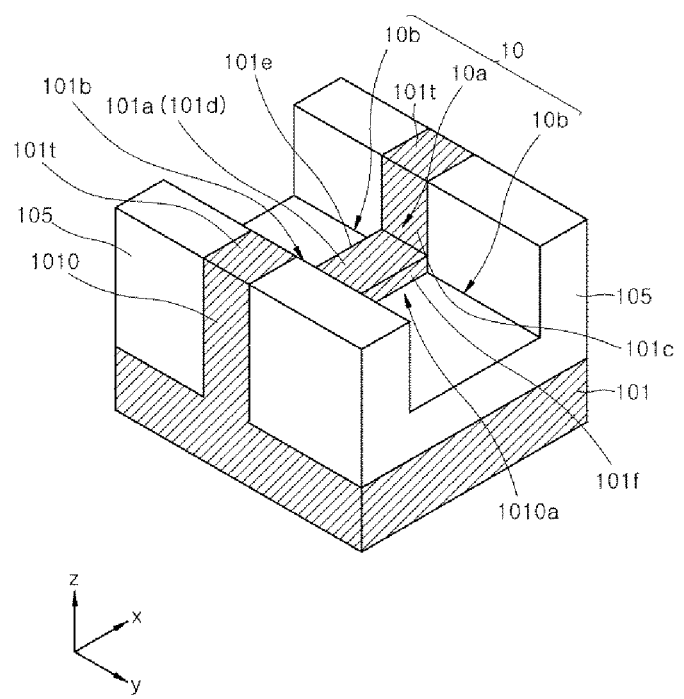

Referring to step S110 of FIG. 3, a substrate 101 including a channel structure 1010 may be provided consistent with processes relating to FIGS. 4 to 6. The channel structure 1010 has a first trench pattern 10a having a bottom surface 101a and sidewall surfaces 101b and 101c.

Referring to FIG. 4, the substrate 101 may be selectively anisotropically etched to form the channel structure 1010. The channel structure 1010 may protrude upwards from first and second surfaces 101S1 and 101S2 of the etched substrate 101. The substrate 101 may include a semiconductor material. In an embodiment, the substrate 101 may be a silicon (Si) substrate doped into p-type. The channel structure 1010 may have an upper surface 101t and side surfaces 101u and 101v. The channel structure 1010 may have predetermined length L1, width W1 and height H1 along the x-direction, the y-direction and the z-direction, respectively. Here, the length L1 may mean the greatest distance between regions where a source region 170 and a drain region 180 are to be formed, as measured along the x-direction, and the height H1 may mean a distance from the first and second surfaces 101S1 and 101S2 to the upper surface 101t of the channel structure 1010.

Next, referring to FIG. 5, an interlayer insulation layer 105 may be formed to surround or cover the channel structure 1010 on the substrate 101. The interlayer insulation layer 105 may be planarized until the upper surface 101t of the channel structure 1010 is exposed. As a result, the upper surface 101t of the channel structure 1010 and upper surfaces of the interlayer insulation layer 105 may be located on the same plane. The interlayer insulation layer 105 may be formed using a chemical vapor deposition method, a coating method and the like, for example. The planarization method may include a chemical mechanical polishing method, an etch back method and the like, for example. The interlayer insulation layer 105 may, for example, include oxide, nitride or oxynitride.

Referring to FIG. 6, the channel structure 1010 and the interlayer insulation layer 105 may be etched to form a trench 10. The trench 10 may include a first trench pattern 10a and a second trench pattern 10b.

In an embodiment, in the structure shown in FIG. 5, the channel structure 1010 may be selectively etched to form the first trench pattern 10a. The first trench pattern 10a may have a bottom surface of the channel structure 1010 disposed substantially on a plane defined by the x-direction and the y-direction and may have sidewall surfaces 101b and 101c of the channel structure 1010 disposed substantially on a plane defined by the y-direction and the z-direction.

In addition, the interlayer insulation layer 105 may be selectively etched to form the second trench pattern 10b. The amount of etching in the thickness direction, that is, the z-direction, with respect to the interlayer insulation layer 105 may be greater than the amount of etching in the thickness direction, with respect to the channel structure 1010 and the first trench pattern 10a. As a result, the channel structure 1010 can protrude in the z-direction compared to the surface of the etched interlayer insulation layer 105. The protruding region of the channel structure 1010 from the surface of the interlayer insulation layer 105 may create a channel recess region 1010a. In the channel recess region 1010a, the channel structure 1010 may have an upper surface 101d and portions of side surfaces 101e and 101f formed by the second trench pattern 10b. The upper surface 101d may be the same plane as the bottom surface 101a of the channel structure 1010 in the first trench pattern 10a.

Figure 7A:
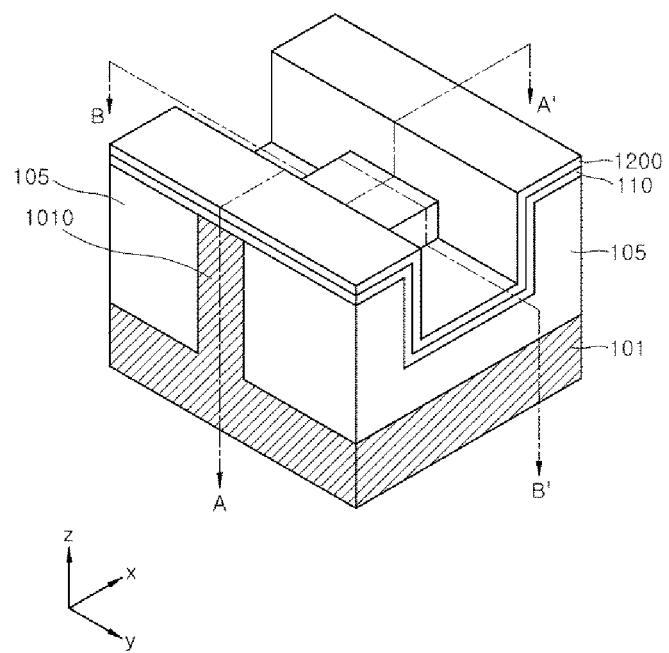
Figure 7B:
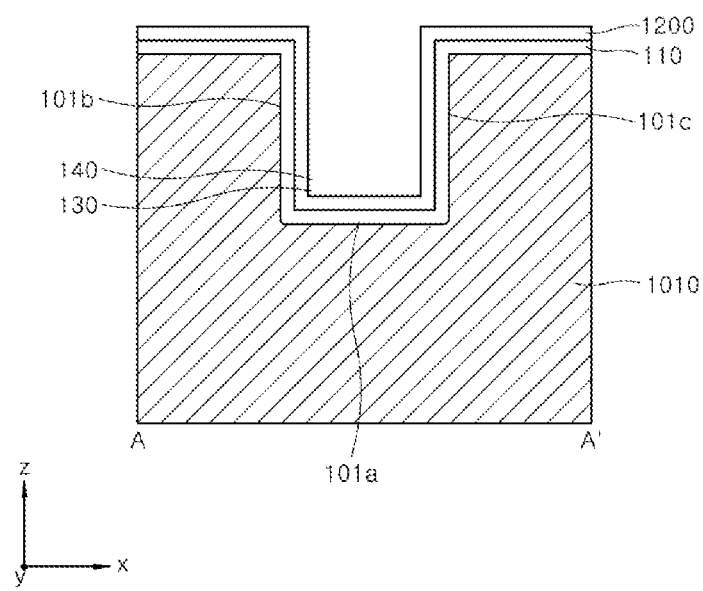
FIGS. 7B, 8B, 9B, 10B, 11B and 12B are cross-sectional views taken along the line A-A' of FIGS. 7A, 8A, 9A, 10A, 11A and 12A, respectively, illustrating a method of manufacturing the ferroelectric semiconductor device.
Figure 7C:
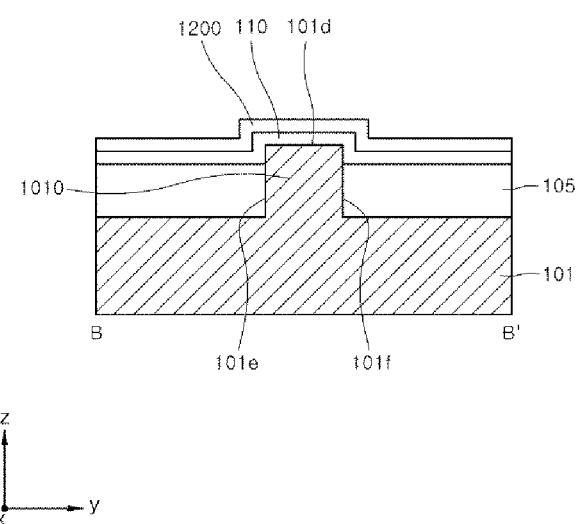
FIGS. 7C, 8C, 9C, 10C, 11C and 12C are cross-sectional views taken along the line B-B' of FIGS. 7A, 8A, 9A, 10A, 11A and 12A, respectively, illustrating a method of manufacturing the ferroelectric semiconductor device.

An amorphous ferroelectric material layer 1200 may be formed on the bottom surface 101a and the sidewall surfaces 101b and 101c of the first trench pattern 10a by performing a process related to step S120 of FIG. 3, and as reflected in FIGS. 7A to 7C. The ferroelectric material layer 1200 may be formed on the upper surface 101d and side surfaces 101e and 101f of the channel structure 1010, and to other surfaces common to trench 10. An interfacial insulation layer 110 may be optionally included under the ferroelectric material layer 1200.

In an embodiment, referring to FIGS. 7A and 7B, the interfacial insulation layer 110 and the ferroelectric material layer 1200 may be sequentially formed on the channel recess region 1010a along the inner surfaces 101a, 101b and 101c of the first trench pattern 10a. In addition, referring to FIGS. 7A and 7C, the interfacial insulation layer 110 and the ferroelectric material layer 1200 may be sequentially formed on surfaces in trench 10 and on an upper surface of the interlayer insulation layer 105 and channel structure 1010.

In an embodiment, the interfacial insulation layer 110 may, for example, include silicon oxide, silicon nitride, silicon oxynitride, aluminum oxide and the like. As an example, when the substrate 101 is a silicon (Si) substrate, the interfacial insulation layer 110 may be a silicon oxide layer, a silicon nitride layer or a silicon oxynitride layer. The interfacial insulation layer 110 may be formed using a chemical vapor deposition method or an atomic layer deposition method, for example. The interfacial insulation layer 110 may be formed in an amorphous state. The interfacial insulation layer 110 may, for example, have a thickness of more than zero (0) to five nanometers (5 nm).

In an embodiment, the ferroelectric material layer 1200 may, for example, include hafnium oxide, zirconium oxide, hafnium zirconium oxide, or a combination of two or more thereof. In an embodiment, the ferroelectric material layer 1200 may include at least one dopant. The ferroelectric material layer 1200 may, for example, include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Ga), lanthanum (La), or a combination of two or more thereof as a dopant.

The ferroelectric material layer 1200 may be formed using a chemical vapor deposition method or an atomic layer deposition method, for example. When the ferroelectric material layer 1200 includes a dopant, the dopant may be introduced into a thin film together with a source material when the thin film is deposited, or the dopant may be injected into the thin film by an ion implantation method and the like after the thin film is deposited. The ferroelectric material layer 1200 may be formed in an amorphous state. The ferroelectric material layer 1200 may be formed to have a thickness of five nanometers (5 nm) to fifteen nanometers (15 nm), for example.

Figure 8A:
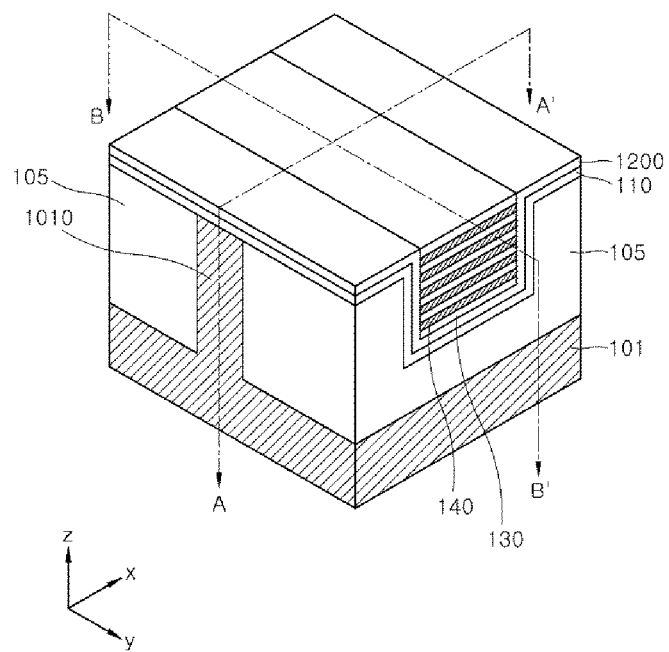
Figure 8B:
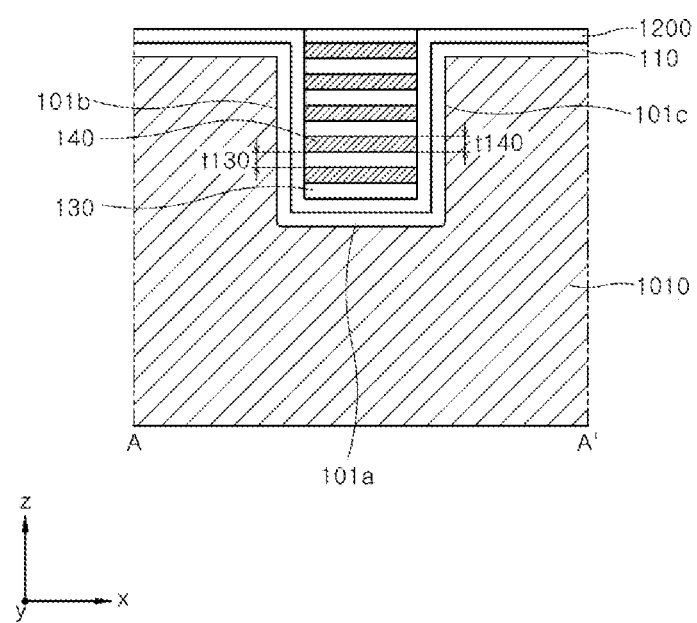
Figure 8C:
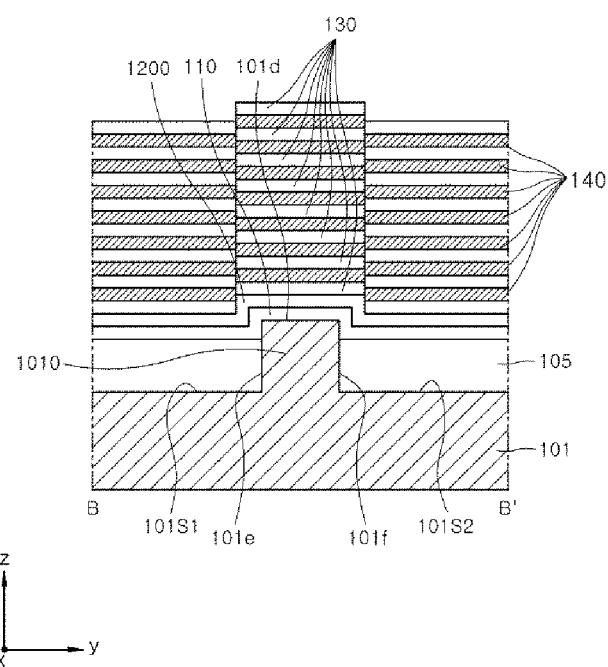

An insulation layer 130 and a ferroelectric crystallization inducing layer 140 may be alternately stacked in trench 10 in the thickness of z-direction on the portion of ferroelectric material layer 1200 common to the bottom surface 101a by performing processes related to step S130 of FIG. 3, and as reflected in FIGS. 8A to 8C.

In an embodiment, referring to FIGS. 8A to 8C, the insulation layer 130 and the ferroelectric crystallization inducing layer 140 may be alternately stacked on the ferroelectric material layer 1200 in the first and second trench patterns 10a and 10b. According to an embodiment, after the insulation layer 130 is formed to directly contact the ferroelectric material layer 1200, the ferroelectric crystallization inducing layer 140 may be disposed on the insulation layer 130. Then, the insulation layer 130 and the ferroelectric crystallization inducing layer 140 can be alternately stacked or disposed in the thickness or z-direction.

The insulation layer 130 and the ferroelectric crystallization inducing layer 140 may be alternately formed from the bottom surface 101a of the first trench pattern 10a in a direction perpendicular to the bottom surface 101a, as illustrated in FIG. 8B, by controlling a thin film formation process condition. That is, the insulation layer 130 and the ferroelectric crystallization inducing layer 140 may be controlled not to grow in the thickness direction on ferroelectric material layer 1200 disposed on the sidewall surfaces 101b and 101c. In addition, as illustrated in FIG. 8C, the insulation layer 130 and the ferroelectric crystallization inducing layer 140 may be formed in a direction perpendicular to the upper surface 101d and the first and second surfaces 101S1 and 101S2. That is, the insulation layer 130 and the ferroelectric crystallization inducing layer 140 may be controlled not to grow in a direction perpendicular to the side surfaces 101e and 101f and may be controlled to grow in a direction perpendicular to the upper surface 101d and the first and second surfaces 101S1 and 101S2. Accordingly, as illustrated in FIGS. 8A and 8B, the side surfaces of the stacked insulation layer 130 and ferroelectric crystallization inducing layer 140 may alternately contact the ferroelectric material layer 1200 on the sidewall surfaces 101b and 101c.

The insulation layer 130 may, for example, include silicon oxide, silicon nitride, silicon oxynitride and the like. The insulation layer 130 may have an amorphous structure. The ferroelectric crystallization inducing layer 140 may, for example, include titanium nitride, tantalum nitride and the like. The ferroelectric crystallization inducing layer 140 may have a crystalline structure. As an example, the ferroelectric crystallization inducing layer 140 may have a single crystalline structure or a polycrystalline structure.

The insulation layer 130 and the ferroelectric crystallization inducing layer 140 may, for example, be formed using an anisotropic deposition method. As an example, the anisotropic deposition may be performed by using a deposition method such as a sputtering method or a chemical vapor deposition method together with a method of inducing a thin film deposition direction using an electric field. That is, when performing the deposition process, a source material is decomposed by plasma or the like so that the source material has a charge. Subsequently, an electric field is applied in a direction perpendicular to the bottom surface 101a and the first and second surfaces 101S1 and 101S2, so that the source material is bonded to the bottom surface 101a and the first and second surfaces 101S1 and 101S2 and then, the insulation layer 130 and the ferroelectric crystallization inducing layer 140 can grow in a direction perpendicular to the bottom surface 101a and the first and second surfaces 101S1 and 101S2. The insulation layer 130 and the ferroelectric crystallization inducing layer 140 are not formed on the ferroelectric material layer 1200 disposed on the sidewall surfaces 101b and 101c, except for the edges or side surfaces of the insulation layer 130 and the ferroelectric crystallization inducing layer 140 in contact with ferroelectric material layer 1200.

Referring to FIGS. 8A and 8B, the insulation layer 130 and the ferroelectric crystallization inducing layer 140 may each be formed to have predetermined thickness t130 and t140, respectively. The thickness t140 of the ferroelectric crystallization inducing layer 140 may be determined in consideration of the length l120a of the portion of the ferroelectric material layer 1200 to be crystallized to form the ferroelectric layer pattern 120a, as illustrated in FIG. 1B. As an example, the thickness t140 of the ferroelectric crystallization inducing layer 140 may be about five nanometers (5 nm) to thirty nanometers (30 nm). The thickness t130 of the insulation layer 130 may be determined in consideration of the length l120b of the portion of the ferroelectric material layer 1200 to be crystallized to form the non-ferroelectric layer pattern 120b, as illustrated in FIG. 1B. In addition, the thickness t130 of the insulation layer 130 may be determined in consideration of the space or interval between the ferroelectric layer patterns 120a. The thickness t130 of the insulation layer 130 may be about one nanometer (1 nm) to thirty nanometers (30 nm).

Portions of the ferroelectric material layer 1200, which contact the ferroelectric crystallization inducing layer 140, may be crystallized to form the ferroelectric layer pattern 120a by performing a process related to step S140 of FIG. 3 and FIGS. 9A to 9C.

Figure 9A:
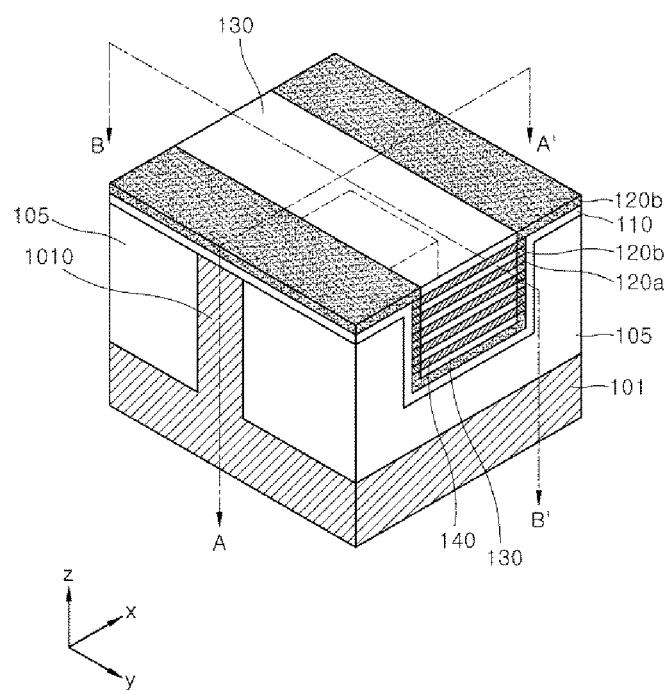
Figure 9B:
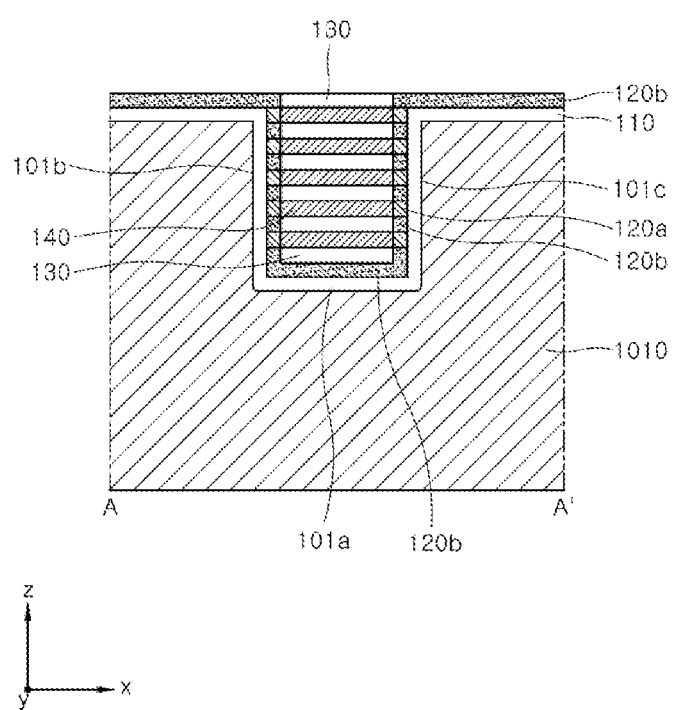
Figure 9C:
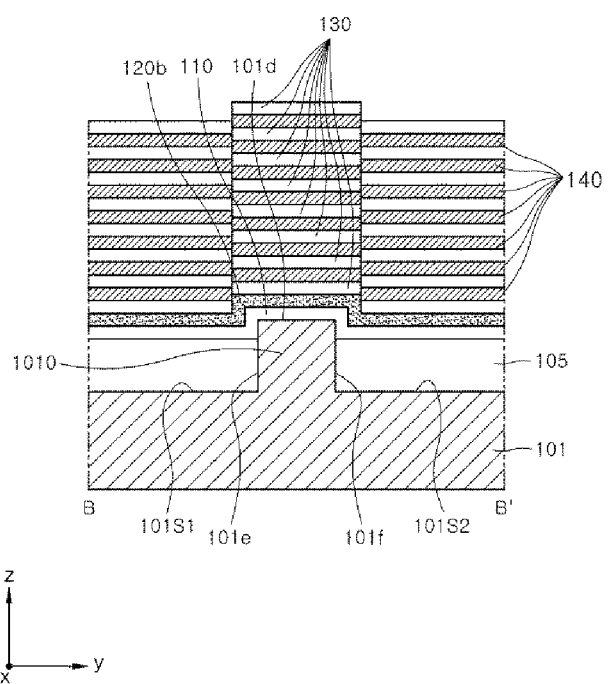

Specifically, referring to FIGS. 9A to 9C, crystallization heat treatment may be carried out to crystallize the ferroelectric material layer 1200. The ferroelectric crystallization inducing layer 140, having a predetermined crystalline structure, can function as a ferroelectric seed layer for inducing crystallization so that the amorphous ferroelectric material layer 1200 has a ferroelectric property. The portions of the ferroelectric material layer 1200, which contact the ferroelectric crystallization inducing layer 140, may be converted into the ferroelectric layer pattern 120a having a ferroelectric property after crystallization heat treatment. On the other hand, portions of the ferroelectric material layer 1200, which contact the insulation layer 130, do not have a ferroelectric property after crystallization heat treatment. These portions can be converted into the non-ferroelectric layer pattern 120b.

The crystallization heat treatment may be performed at a process temperature of about five hundred degrees Celsius (500° C.) to ten hundred degrees Celsius (1,000° C.), for example. As an example, the crystallization heat treatment may be performed in an oxidation atmosphere. As another example, the crystallization heat treatment may be performed in a non-reactive gas atmosphere. As another example, the crystallization heat treatment may be performed in a reduction atmosphere.

Figure 10A:
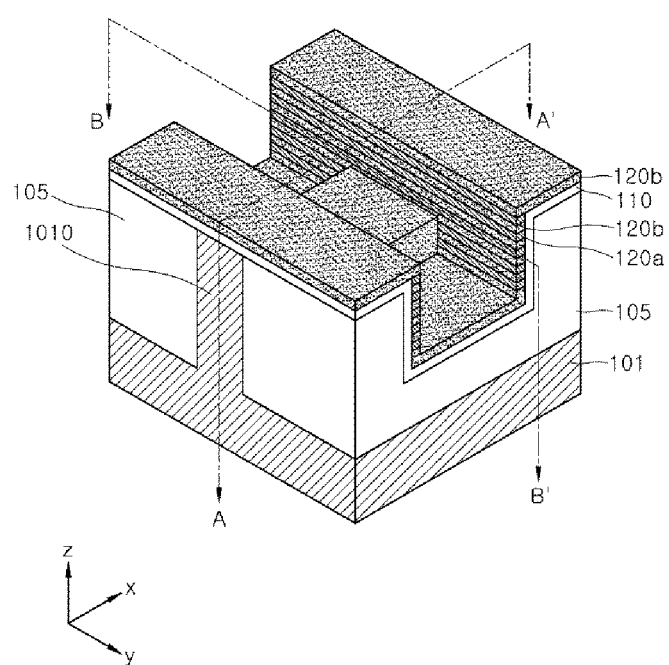
Figure 10B:
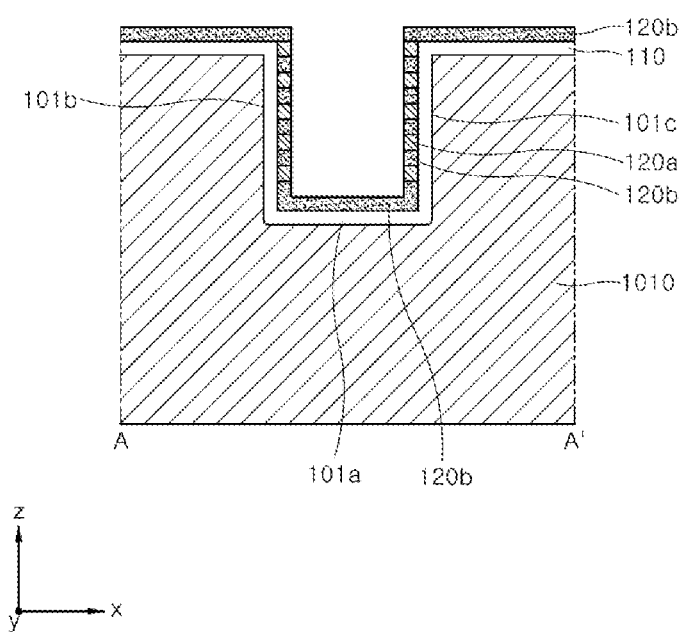
Figure 10C:
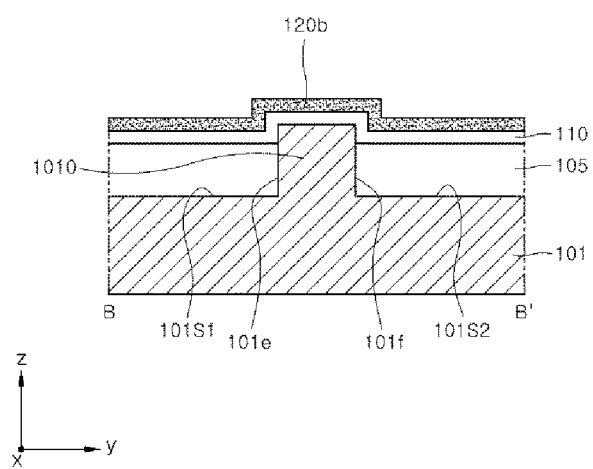

Referring to step S150 of FIG. 3, and in reference to FIGS. 10A to 10C, after the crystallization heat treatment, the insulation layers (130 of FIGS. 9A to 9C) and the ferroelectric crystallization inducing layers (140 of FIGS. 9A to 9C) may be removed. Accordingly, the ferroelectric layer pattern 120a and the non-ferroelectric layer pattern 120b in trench 10 may be exposed. The insulation layers and the ferroelectric crystallization inducing layers may be removed using a wet etching method, a dry etching method, or a combination thereof.

The first and second trench patterns 10a and 10b may be filled with a conductive material to form a gate electrode layer 155 by performing a process related to step S160 of FIG. 3, as illustrated in FIGS. 11A to 11C, and FIGS. 12A to 12C.

Figure 11A:
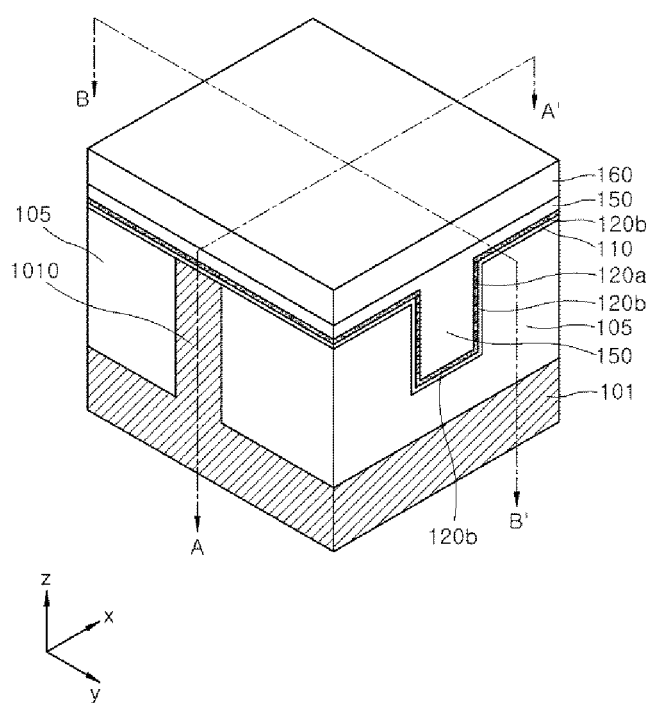
Figure 11B:
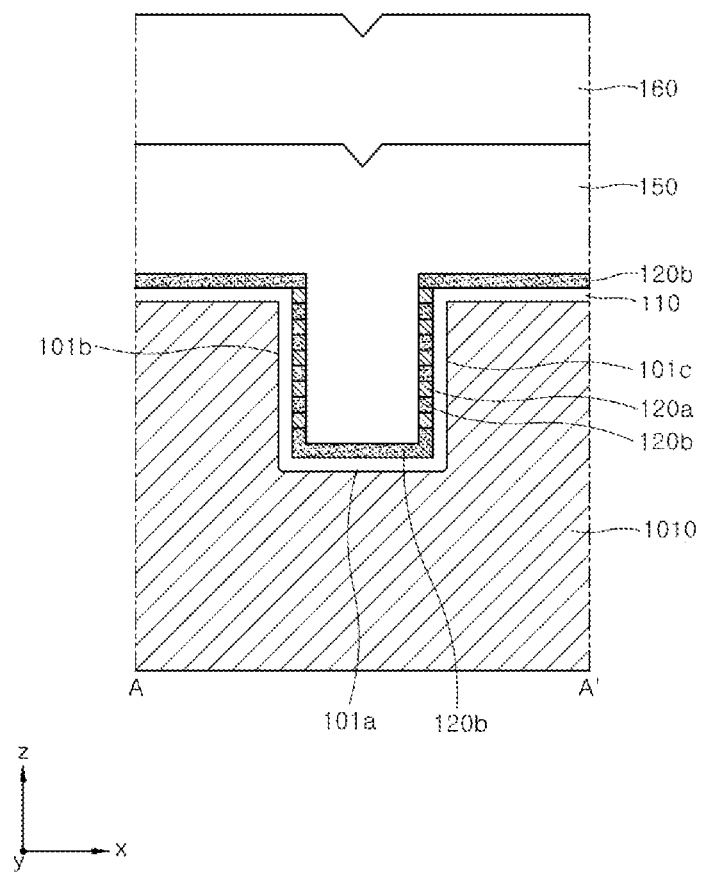
Figure 11C:
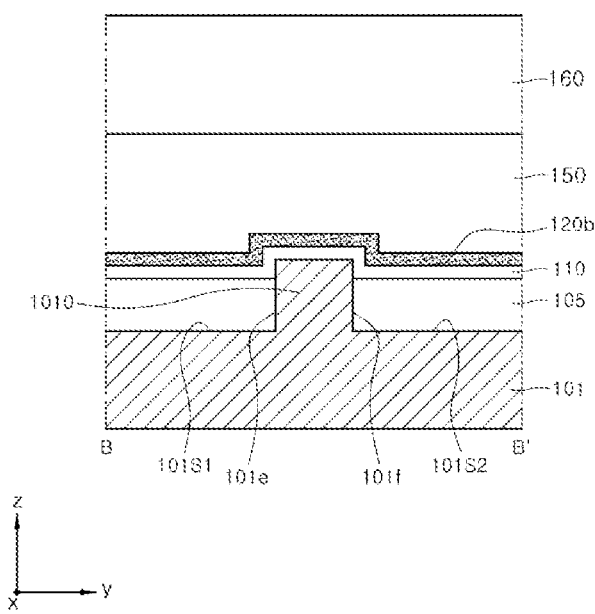

Specifically, referring to FIGS. 11A to 11C, a conductive material layer 150 may be formed in the first and second trench patterns 10a and 10b and on non-ferroelectric pattern 120b after the insulation layers (130 of FIGS. 9A to 9C) and the ferroelectric crystallization inducing layers (140 of FIGS. 9A to 9C) are removed. In addition, an upper conductive thin film 160 may be formed on the conductive material layer 150.

The conductive material layer 150 and the upper conductive thin film 160 may, for example, include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The upper conductive thin film 160 may include a material having lower resistivity than the conductive material layer 150. The conductive material layer 150 and the upper conductive thin film 160 may, for example, be formed using a chemical vapor deposition method, an atomic layer deposition method, or a sputtering method. Next, referring to FIGS. 12A to 12C, the conductive material layer 150 and the upper conductive thin film 160 may be selectively etched to form a gate electrode layer 155 and an upper electrode layer 165.

Figure 12A:
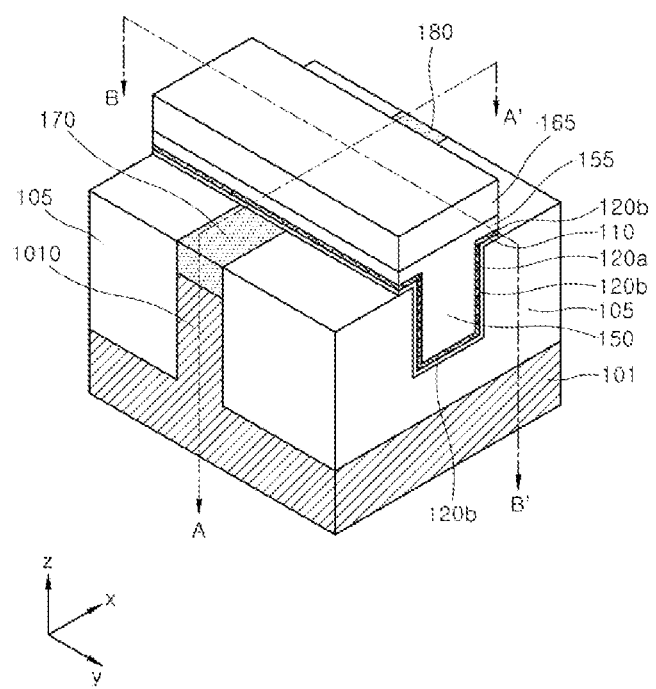
Figure 12B:
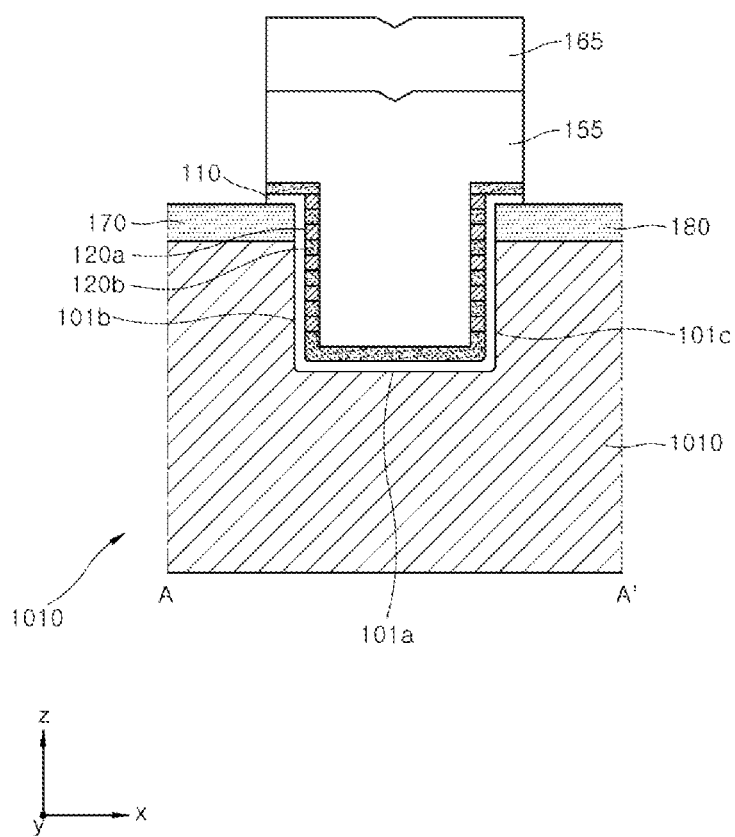
Figure 12C:
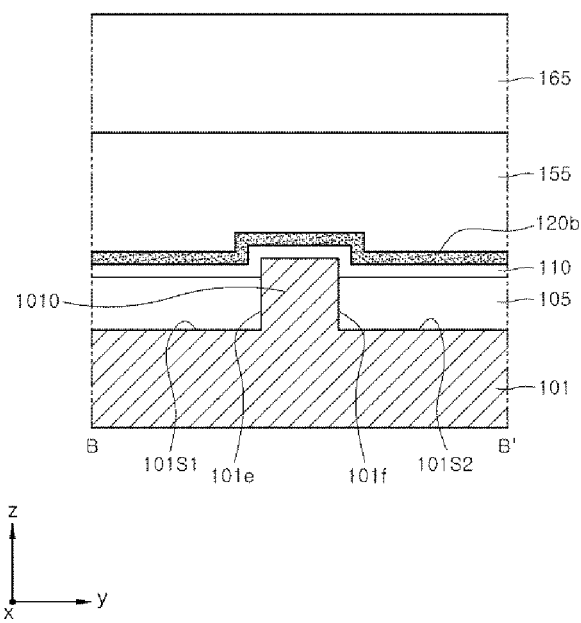

A source region 170 and a drain region 180 may be formed in regions of the channel structure 1010, which are located at opposite ends of the gate electrode layer 155 by performing processes related to step S170 of FIG. 3, and as illustrated in FIGS. 12A to 12C.

Specifically, as the gate electrode layer 155 and the upper electrode layer 165 are formed, a dopant injection process may be performed with respect to the exposed channel structure 1010 to form the source region 170 and the drain region 180. In an embodiment, when the channel structure 1010 is doped with a dopant of a predetermined conductive type, the source region 170 and the drain region 180 may be regions doped with a dopant of the opposite conductive type. As an example, when the channel structure 1010 is doped into p-type, the source and drain regions 170 and 180 may be formed by selectively injecting an n-type dopant into the channel structure 1010. As another example, when the channel structure 1010 is doped into n-type, the source and drain regions 170 and 180 may be formed by selectively injecting an p-type dopant into the channel structure 1010. The method of injecting dopant may, for example, be an ion implantation method.

By performing the above-described processes, the ferroelectric semiconductor device according to an embodiment of the present disclosure can be manufactured. The manufactured ferroelectric semiconductor device may be substantially the same as the ferroelectric semiconductor device 1 described above with reference to FIGS. 1A to 1C.

In some embodiments, in processes related to FIGS. 7A to and 7C, the interfacial insulation layer 110 may be omitted. In such cases, the ferroelectric material layer 1200 may be directly formed on the channel structure 1010 and the interlayer insulation layer 105.

Figure 13:
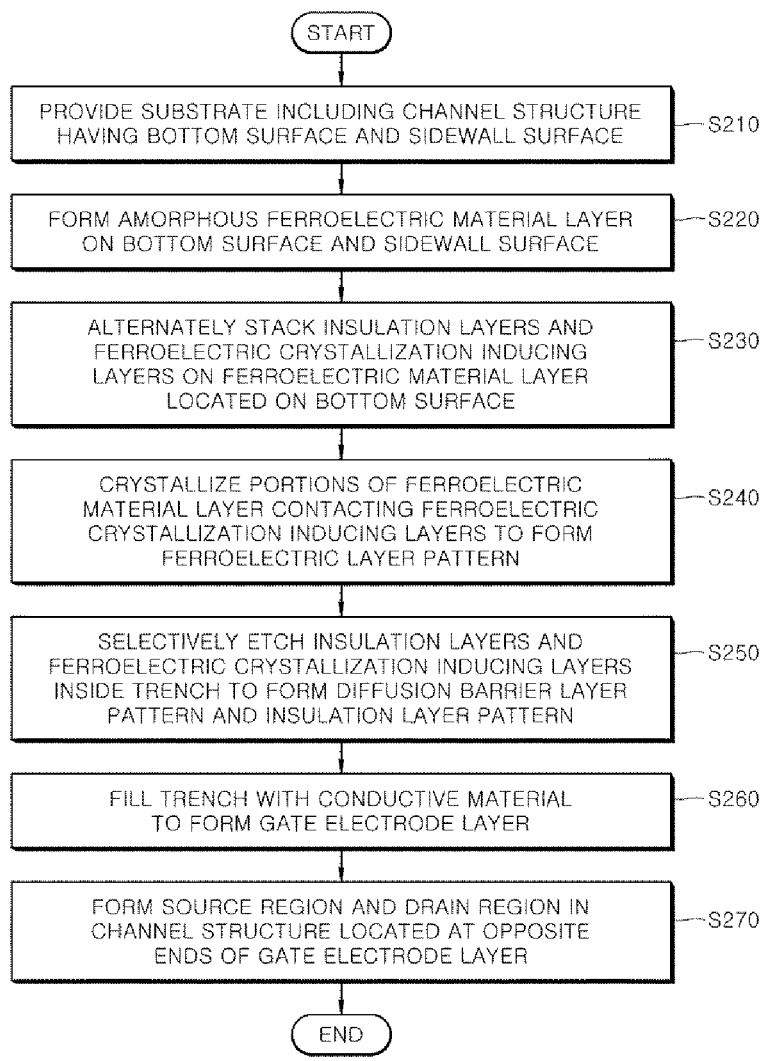
FIG. 13 is a flow chart schematically illustrating a method of manufacturing a ferroelectric semiconductor device according to another embodiment of the present disclosure.
Figure 14A:
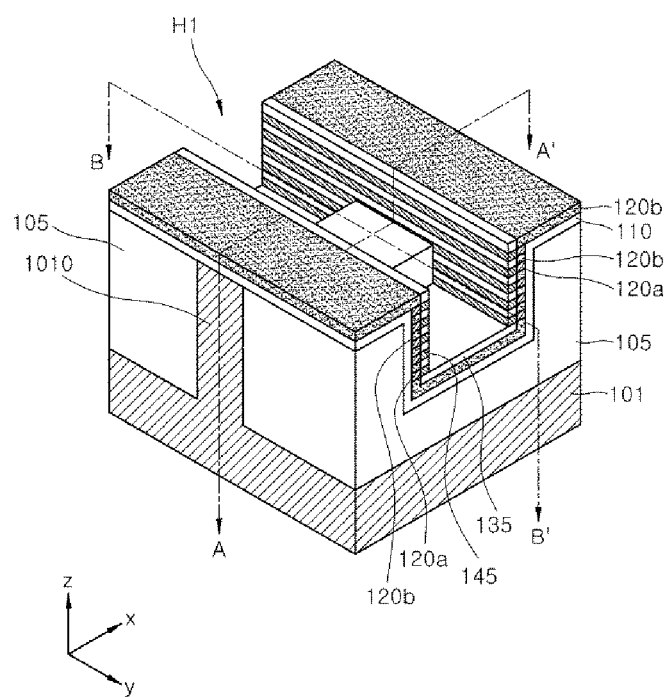
FIGS. 14A, 15A and 16A are perspective views schematically illustrating a method of manufacturing a ferroelectric semiconductor device according to another embodiment of the present disclosure.
Figure 14B:
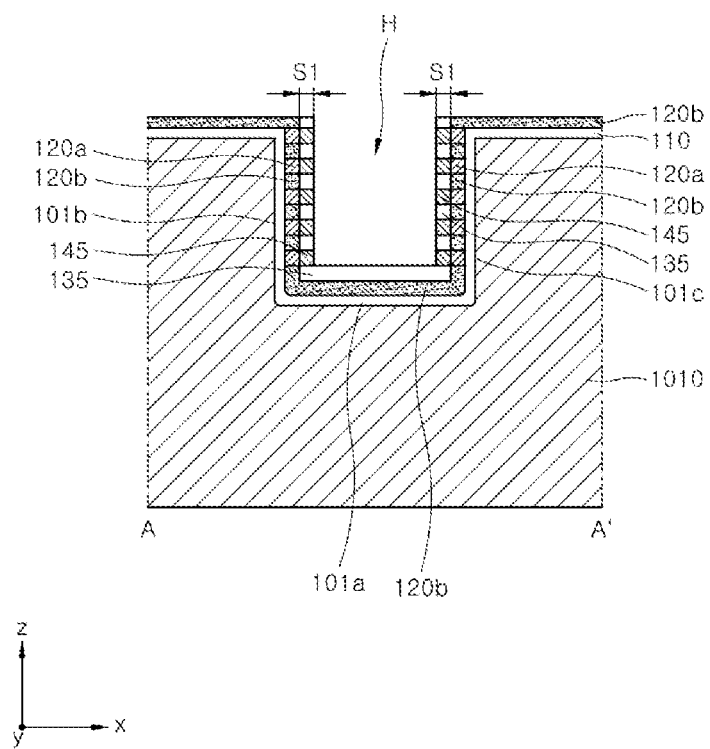
FIGS. 14B, 15B and 16B are cross-sectional views taken along the line A-A' of FIGS. 14A, 15A and 16A, respectively, illustrating a method of manufacturing the ferroelectric semiconductor device.
Figure 15A:
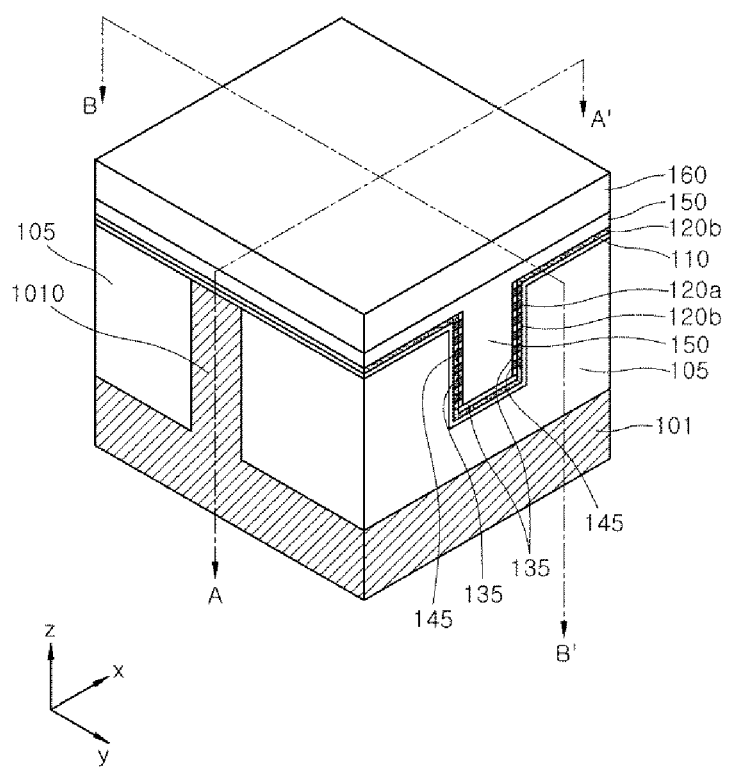
Figure 15B:
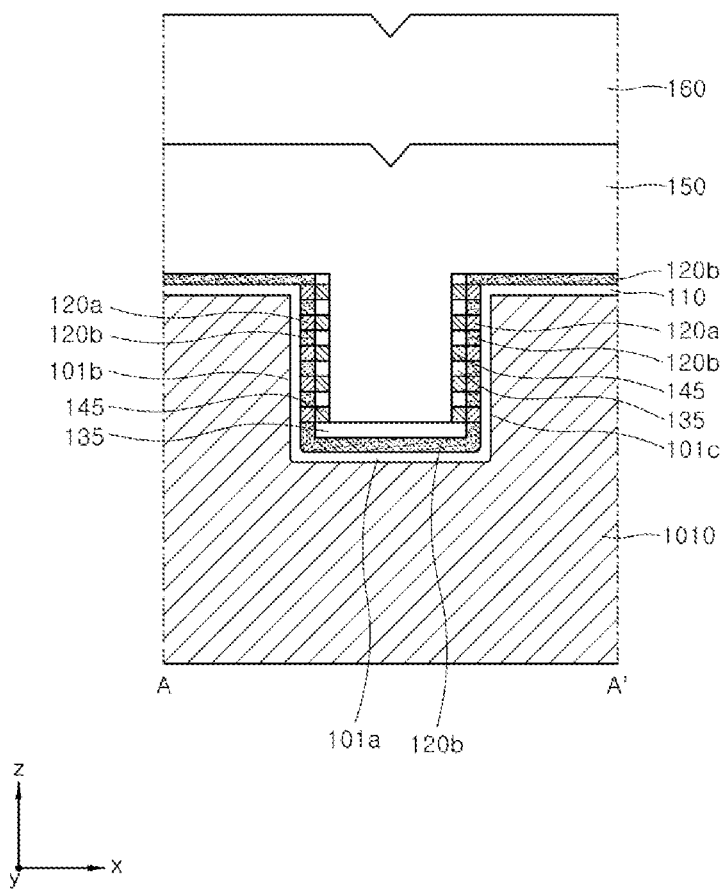
Figure 15C:
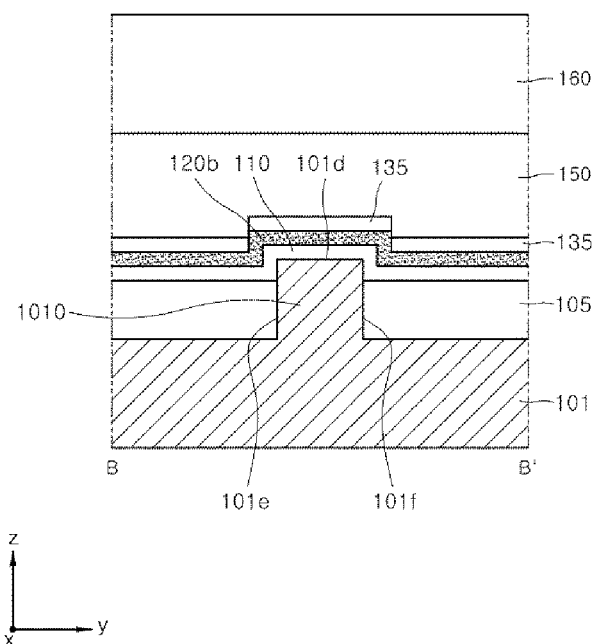
Figure 16A:
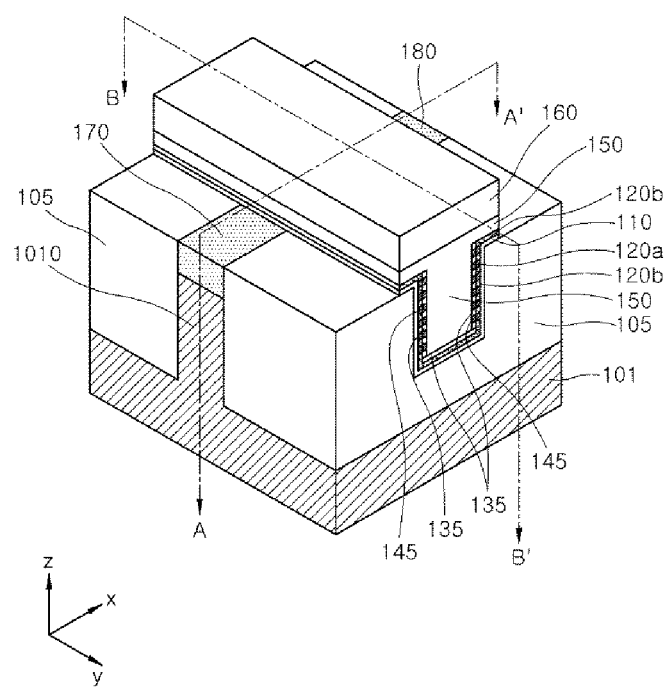
Figure 16B:
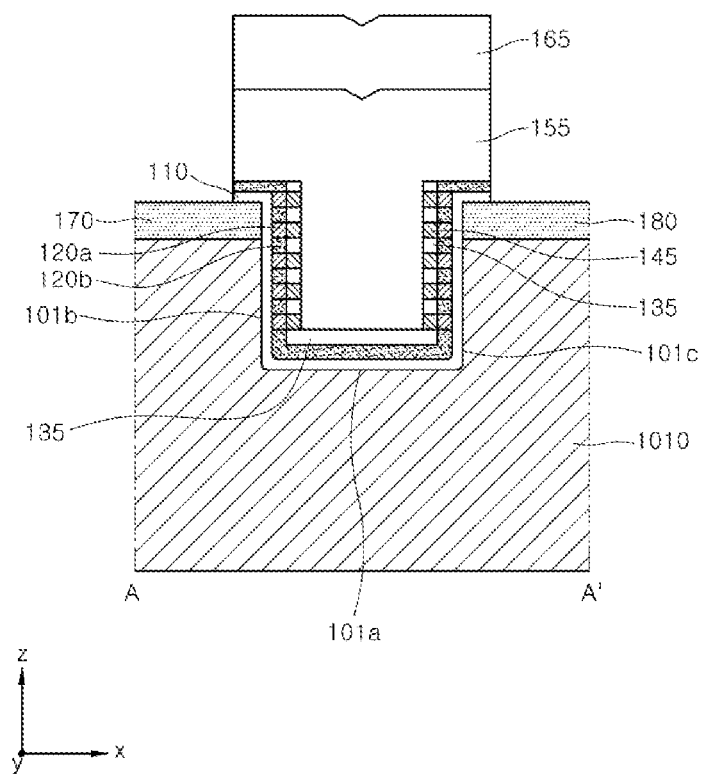
Figure 16C:
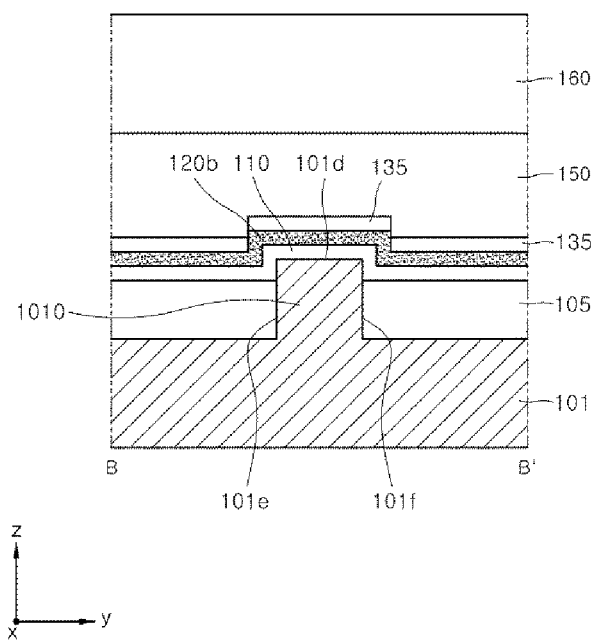

FIG. 13 is a flow chart schematically illustrating a method of manufacturing a ferroelectric semiconductor device according to another embodiment of the present disclosure. FIGS. 14A, 15A and 16A are perspective views schematically illustrating a method of manufacturing the ferroelectric semiconductor device according to another embodiment of the present disclosure. FIGS. 14B, 15B and 16B are cross-sectional views taken along the line A-A' of FIGS. 14A, 15A and 16A illustrate a method of manufacturing the ferroelectric semiconductor device, and FIGS. 14C, 15C and 16C are cross-sectional views taken along the line B-B' of FIGS. 14A, 15A and 16A illustrate a method of manufacturing the ferroelectric semiconductor device.

The processes of steps S210 to S240 of FIG. 13 may be substantially the same as the processes of steps S110 to S140 of FIG. 3. As a result, substantially the same structure as the structure described above and with reference to FIGS. 9A, 9B and 9C can be formed.

Figure 14C:
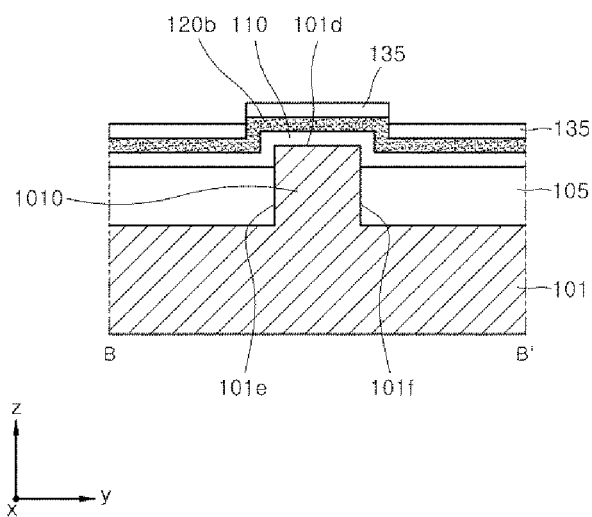
FIGS. 14C, 15C and 16C are cross-sectional views taken along the line B-B' of FIGS. 14A, 15A and 16A, respectively, illustrating a method of manufacturing the ferroelectric semiconductor device.

From the structure described above with reference to FIGS. 9A, 9B and 9C, portions of the insulation layers 130 and the ferroelectric crystallization inducing layers 140 inside the first and second trench patterns 10a and 10b may be selectively etched to form an insulation layer pattern 135 and a diffusion barrier layer pattern 145 by performing processes related to step S250 of FIG. 13, and as illustrated in FIGS. 14A to 14C.

Specifically, referring to FIGS. 14A and 14B, the insulation layer 130 and the ferroelectric crystallization inducing layer 140 may be selectively and anisotropically etched to form a hole H, leaving a single layer of insulation pattern 135 in the bottom of the hole H. The single layer of insulation pattern 135 contacts the non-ferroelectric pattern 120b. The insulation layer pattern 135 and the diffusion barrier layer pattern 145 may be formed to have a predetermined width S1 on the side surfaces of the non-ferroelectric layer pattern 120b and the ferroelectric layer pattern 120a.

The diffusion barrier layer pattern 145 may be a portion of the ferroelectric crystallization inducing layer 140, which contacts the ferroelectric layer pattern 120a. The diffusion barrier layer pattern 145 may act to suppress the diffusion of materials between the ferroelectric layer pattern 120a and the gate electrode layer 155. The width S1 of the diffusion barrier layer pattern 145 may be controlled so as to effectively suppress material diffusion. As an example, the width S1 of the diffusion barrier layer pattern 145 may be about five nanometers (5 nm) to thirty nanometers (30 nm). The insulation layer pattern 135 may be a portion of the insulation layer 130, which contacts the non-ferroelectric layer pattern 120b.

The first and second trench patterns 10a and 10b in which the insulation layer pattern 135 and the diffusion barrier layer pattern 145 are formed may be subsequently filled with a conductive material to form the gate electrode layer 155 by performing a process related to step S260 of FIG. 13, as illustrated in FIGS. 15A to 15C, and FIGS. 16A to 16C. The process of this step may be substantially the same as the process described above with reference to step S160, FIGS. 11A to 11C, and FIGS. 12A to 12C.

The source region 170 and the drain region 180 may be formed in regions of the channel structure 1010, which are located at opposite ends of the gate electrode layer 155 by performing a process related to step S270, and as illustrated in FIGS. 16A to 16C. The processes of this step may be substantially the same as the processes described above and with reference to step S160 of FIG. 3, and as illustrated in FIGS. 12A to 12C.

The ferroelectric semiconductor device according to another embodiment of the present disclosure can be manufactured by the preceding described processes. The manufactured ferroelectric semiconductor device may be substantially the same as the ferroelectric semiconductor device 2 described above with reference to FIGS. 2A to 2C.

According to the embodiments of the present disclosure, a ferroelectric semiconductor device including a ferroelectric layer pattern having controlled grain size and grain size uniformity. The grain size of the ferroelectric layer pattern and the uniformity of the grain size can be controlled by using a ferroelectric crystallization inducing layer. The resultant ferroelectric layer pattern, the polarization axes formed in the crystal grains can be uniformly aligned, and the deviation in alignment of the polarization axes between the crystal grains can be reduced.

In addition, since the ferroelectric polarization formed in the crystal grains are aligned to be parallel to the polarization axes, the degree of alignment of the polarization axes is improved, and the magnitude of the ferroelectric polarization of the ferroelectric layer pattern can be improved. As a result, a ferroelectric semiconductor device capable of improving the reliability of the ferroelectric polarization switching operation can be manufactured.

The embodiments of the inventive concepts have been disclosed above for illustrative purposes. Those of ordinary skill in the art will appreciate that various modifications, additions and substitutions are possible, without departing from the scope and spirit of the inventive concepts as disclosed in the accompanying claims.

What is claimed is:

1. A ferroelectric semiconductor device comprising:
a substrate having a channel structure;
a trench pattern having a bottom surface and a sidewall surface in the channel structure;
a dielectric layer disposed on the bottom surface and the sidewall surface of the trench pattern, the dielectric layer comprising a ferroelectric layer pattern and a non-ferroelectric layer pattern that are alternately disposed along the sidewall surface of the trench pattern;
a gate electrode layer disposed on the dielectric layer;
a source region and a drain region formed in the channel structure located at opposite ends of the gate electrode layer;
a diffusion barrier layer pattern disposed between the gate electrode layer and the ferroelectric layer pattern, the diffusion barrier layer pattern being a migration barrier of an oxygen in the ferroelectric layer pattern and a metal in the gate electrode layer; and
an insulation pattern disposed between the gate electrode layer and the non-ferroelectric layer pattern,
wherein the bottom surface and the sidewall surface of the trench pattern directly contact the channel structure,
wherein the sidewall surface of the trench pattern directly contacts the source region and the drain region,
wherein the diffusion barrier layer pattern and the insulation pattern are alternately disposed along the sidewall surface of the trench pattern, and
wherein the diffusion barrier layer pattern having a crystalline structure contacts the ferroelectric layer pattern, and the insulation pattern having an amorphous structure contacts the non-ferroelectric layer pattern.

2. The ferroelectric semiconductor device of claim 1, wherein each of the ferroelectric layer pattern and the non-ferroelectric layer pattern has a crystalline structure.

3. The ferroelectric semiconductor device of claim 2, wherein each of the ferroelectric layer pattern and the non-ferroelectric layer pattern has a different crystal lattice structure.

4. The ferroelectric semiconductor device of claim 1, wherein the diffusion barrier layer pattern has the crystalline structure having a lattice constant different from that of the ferroelectric layer pattern.

5. The ferroelectric semiconductor device of claim 4, wherein the diffusion barrier layer pattern comprises titanium nitride or tantalum nitride.

6. The ferroelectric semiconductor device of claim 1, wherein the insulation pattern comprises silicon oxide, silicon nitride, or silicon oxynitride.

7. The ferroelectric semiconductor device of claim 1, wherein the ferroelectric layer pattern comprises at least one selected from the group consisting of hafnium oxide, zirconium oxide, and hafnium zirconium oxide.

8. The ferroelectric semiconductor device of claim 7, wherein the ferroelectric layer pattern comprises at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Ga), and lanthanum (La) as a dopant.

9. The ferroelectric semiconductor device of claim 1, wherein the gate electrode layer comprises at least one selected from the group consisting of tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, and ruthenium oxide.

10. The ferroelectric semiconductor device of claim 1, wherein the ferroelectric layer pattern has a cross-sectional structure of a single grain.

* * * * *